(12) United States Patent
Chidambaram

(10) Patent No.: US 7,560,324 B2
(45) Date of Patent: Jul. 14, 2009

(54) DRAIN EXTENDED MOS TRANSISTORS AND METHODS FOR MAKING THE SAME

(75) Inventor: Pr Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/886,842

(22) Filed: Jul. 8, 2004

(65) Prior Publication Data

US 2006/0006461 A1  Jan. 12, 2006

(51) Int. Cl.
*H01L 21/338* (2006.01)
*H01L 21/336* (2006.01)

(52) U.S. Cl. .................. 438/179; 438/286; 438/290; 438/306; 257/E21.427

(58) Field of Classification Search ........... 438/262, 438/286, 290, 306, 232, 179; 257/E21.427, 257/E21.642
See application file for complete search history.

(56) References Cited

U.S. PATENT DOCUMENTS

| | | | | |
|---|---|---|---|---|
| 4,823,173 A * | 4/1989 | Beasom | ............. | 257/262 |
| 5,648,288 A * | 7/1997 | Williams et al. | ............. | 438/202 |
| 5,831,320 A * | 11/1998 | Kwon et al. | ............. | 257/409 |
| 5,907,173 A * | 5/1999 | Kwon et al. | ............. | 257/336 |
| 6,127,703 A | 10/2000 | Letavic et al. | | |
| 6,211,552 B1 | 4/2001 | Efland et al. | | |
| 6,521,946 B2 | 2/2003 | Mosher | | |
| 6,531,355 B2 | 3/2003 | Mosher et al. | | |
| 6,548,874 B1 | 4/2003 | Morton et al. | | |
| 6,620,688 B2 * | 9/2003 | Woo et al. | ............. | 438/262 |
| 6,639,284 B1 | 10/2003 | Chatterjee et al. | | |
| 6,806,128 B2 * | 10/2004 | Ootsuka et al. | ............. | 438/199 |
| 6,822,292 B2 * | 11/2004 | Beasom | ............. | 257/343 |
| 6,836,148 B2 * | 12/2004 | Pullen et al. | ............. | 326/81 |
| 6,927,453 B2 * | 8/2005 | Shibib et al. | ............. | 257/336 |
| 2003/0008482 A1 | 1/2003 | Chidambaram | | |
| 2004/0031970 A1 | 2/2004 | Chakravarthi et al. | | |
| 2005/0017298 A1 * | 1/2005 | Xie et al. | ............. | 257/336 |

FOREIGN PATENT DOCUMENTS

EP    1265277 A2 *  12/2002

* cited by examiner

*Primary Examiner*—Walter L Lindsay, Jr.
*Assistant Examiner*—Ron E Pompey
(74) *Attorney, Agent, or Firm*—Wade J. Brady, III; Frederick J. Telecky, Jr.

(57) ABSTRACT

Drain extended MOS transistors (52) and fabrication methods (100) therefor are presented, in which a voltage drop region (80) is provided in a well (82) of a second conductivity type between a channel (78) of a first conductivity type and a drain (74) to inhibit channel hot carrier or direct tunneling degradation of the transistor gate dielectric (64) for high voltage operation. The voltage drop region (80) has more dopants of the first conductivity type and/or fewer dopants of the second conductivity type than does the well (82) so as to shift the high fields away from the transistor gate dielectric (64).

13 Claims, 17 Drawing Sheets

DRAIN EXTENDED MOS TRANSISTORS AND METHODS FOR MAKING THE SAME

FIELD OF INVENTION

The present invention relates generally to semiconductor devices and more particularly to improved drain extended MOS transistors and fabrication methods for making the same.

BACKGROUND OF THE INVENTION

Many integrated circuit devices include digital circuitry formed of metal-oxide-semiconductor (MOS) transistor devices, which are built using complementary MOS (CMOS) fabrication processes optimized for high-density, high-speed N-channel and P-channel MOS transistors. Such high-density circuitry is common in modern consumer electronic products such as wireless communications devices, portable computers, etc., in which digital circuitry is powered by batteries. In such products, it is desirable to provide a maximum amount of functionality in a limited amount of space, while keeping power consumption and cost to a minimum. To optimize circuit functionality, area, and power consumption, transistor sizes are often minimized and the transistors are designed to operate at low voltage levels. In addition, the use of simple fabrication processes aids in keeping product manufacturing costs to a minimum, wherein it is desirable to fabricate both low voltage and higher voltage transistors in an integrated circuit (IC) using a single streamlined fabrication process flow.

In fabricating integrated circuits for such battery powered products, a certain number of transistors are needed for switching power from the battery. These power transistors may need to withstand higher voltages than do the logic transistors of the IC. For example, logic transistors may be operated at voltages of about 1.8 volts or less, whereas battery power transistors may be used to switch power from batteries at 6 volts or higher. Such power switching circuits are often fabricated using N or P channel drain-extended metal-oxide-semiconductor (DEMOS) transistor devices, such as lateral diffused MOS (LDMOS) devices or REduced SURface Field (RESURF) transistors. DEMOS devices advantageously combine short-channel operation with high current handling capabilities, relatively low drain-to-source on-state resistance (Rdson), and the ability to withstand relatively high drain-to-source voltages without suffering voltage breakdown failure, where DEMOS device designs often involve a tradeoff between breakdown voltage (BVdss) and Rdson. In addition to performance advantages, DEMOS device fabrication is relatively easy to integrate into CMOS process flows, facilitating use in devices where logic, low power analog, or other circuitry is also to be fabricated in a single integrated circuit (IC).

Fabrication of semiconductor products typically involves a large number of processing steps, many of which employ masks for selectively operating on specific portions of a semiconductor wafer. Manufacturing cost for integrated circuits is a function of the number of processing steps in a given process flow, wherein reducing the number of masks and processing steps reduces the manufacturing cost. In attempting to fabricate both low voltage logic transistors and higher voltage DEMOS transistors using a streamlined fabrication process flow, the use of a single transistor gate dielectric or gate oxide is desired, in order to minimize the number of masks in the process.

In order to maintain the optimized performance of the high-speed performance of the logic transistors, moreover, thin gate dielectrics are desirable. However, the thin gate dielectric is prone to degradation from channel hot carriers and direct tunneling currents where high electric fields are present in the underlying semiconductor material. In power transistors used to switch battery power, the use of such thin gate dielectrics often results in reliability problems, wherein the spacing of the drain away from the gate may not be adequate to prevent high electric fields near the thin gate dielectric. Accordingly, there is a need for improved DEMOS transistors and fabrication methods by which streamlined fabrication processes can be used to create both low voltage logic and DEMOS transistors, while mitigating or avoiding degradation of the DEMOS transistors in semiconductor products.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to improved drain extended MOS transistors and fabrication methods therefor, whereby DEMOS and logic transistors can be fabricated using standard CMOS process flows without adding new masks, while providing more robust DEMOS transistors for higher voltage operation, wherein the invention may be employed in association with NMOS and/or PMOS drain-extended transistors. In the case of a DEPMOS transistor, a voltage drop region is provided in a compensated p-well between an n-doped channel and a p-type drain, so as to inhibit channel hot carrier or direct tunneling degradation of the transistor gate dielectric for high voltage operation. The voltage drop region has more n-type dopants and/or fewer p-type dopants than does the p-well, and operates to shift the high fields toward the drain and away from the transistor gate dielectric so as to mitigate damage to or degradation of the gate dielectric.

One aspect of the invention provides a drain extended MOS (DEMOS) transistor, comprising a gate overlying a channel region of a first conductivity type in a semiconductor body, a source of a second conductivity type formed along a first side of the channel, a well of the second conductivity type that extends under a portion of the gate from a second side of the channel to beyond the gate, and a drain of the second conductivity type formed in the well, where the drain is spaced from the side of the gate. The DEMOS transistor further comprises a voltage drop region in the well extending between a first end proximate the gate to a second end, where the voltage drop region has fewer dopants of the second conductivity type than the well. In another aspect of the invention, the voltage drop region is laterally spaced from the drain, wherein the voltage drop region has more dopants of the first conductivity type than the well.

Another aspect of the invention provides methods for fabricating a drain-extended MOS transistor, in which a voltage drop region is formed in a well between a channel of a first conductivity type and a drain of a second conductivity type, wherein the voltage drop region has fewer dopants of the second conductivity type and/or more dopants of the first conductivity type than does the well. The voltage drop region can be formed in a variety of ways, including covering or masking at least a portion of the voltage drop region while forming the well to reduce the number of second type dopants in the region, exposing all or a portion of the voltage drop region while performing a source/drain implant for another transistor using dopants of the first conductivity type, and/or exposing at least a portion of the region while performing a pocket implant using dopants of the second conductivity type.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
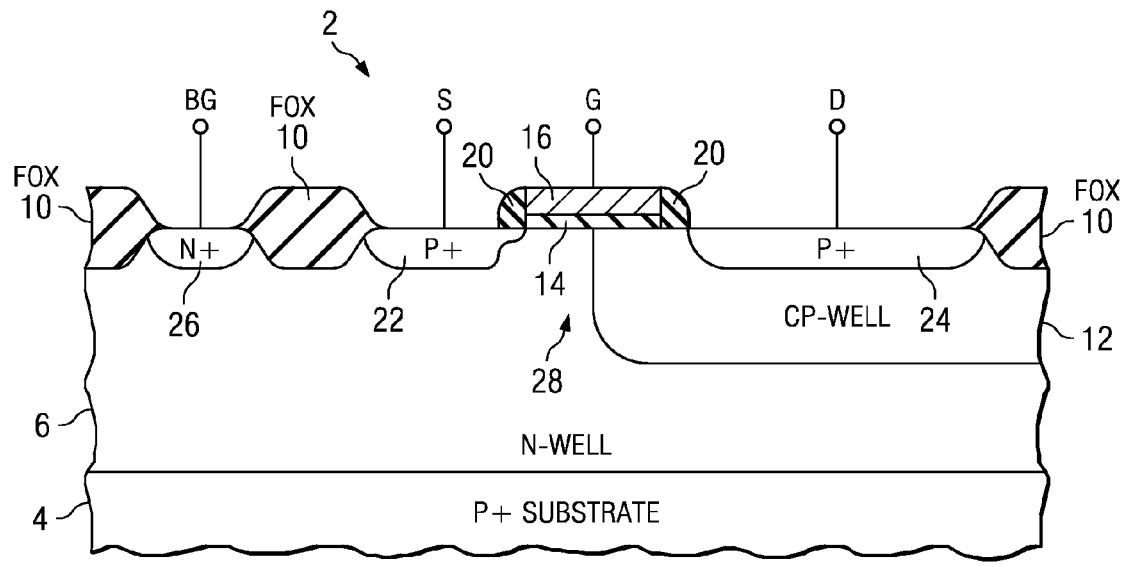
FIG. 1 is a partial side elevation view in section illustrating a conventional drain extended PMOS transistor with a p-type drain spaced from the gate by a sidewall spacer.

One or more implementations of the present invention will now be described with reference to the attached drawings, wherein like reference numerals are used to refer to like elements throughout, and wherein the illustrated structures are not necessarily drawn to scale. The invention provides drain extended MOS (DEMOS) transistors and fabrication techniques by which various shortcomings of conventional DEMOS transistors can be mitigated or overcome, and which facilitate providing improved DEMOS transistors using streamlined CMOS fabrication process flows without the addition of extra masks or processing steps. The various aspects of the invention are hereinafter illustrated and described in the context of several implementations of an exemplary drain extended PMOS transistor. However, the invention may also be employed in conjunction with drain extended NMOS (DENMOS) transistors with p-type regions being substituted for n-type regions and vice versa, wherein all such variant implementations are contemplated as falling within the scope of the invention and the appended claims.

Referring initially to FIG. 1, a conventional drain extended PMOS transistor 2 is illustrated with a p-type drain 24 spaced from a gate 14, 16 by only a sidewall spacer 20. This form of DEPMOS may be less than optimal for reliable switching of higher voltages, such as in battery powered circuit applications, wherein the proximity of the drain 24 to the gate 14, 16 leads to direct tunneling and/or channel hot carrier (CHC) degradation of the thin gate oxide 14. The DEPMOS transistor 2 is formed in a p-doped silicon substrate 4, with an n-well 6 being formed in an upper portion of the substrate 4. A compensated p-well 12 is formed in a portion of the n-well 6, and various field oxide (FOX) isolation structures 10 are formed to separate different terminals of the transistor 2 from one another and from other components in the integrated circuit. The gate structure includes a thin gate dielectric or gate oxide 14 formed over a channel region 28 of the n-well 6, which also partially overlies a portion of the compensated p-well 12, with a conductive gate electrode 16 formed over the thin gate oxide 14 and sidewall spacers 20 formed along the lateral sides of the gate. The conventional DEPMOS also includes p-type source and drain regions 22 and 24, respectively, with the source 22 being formed in the n-well 22 on one side of the channel 28 and the drain 24 being spaced outwardly from the opposite lateral side of the channel 28 in the p-well 12. The DEPMOS device 2 also includes an n-type back gate 26 formed in the n-well 6 to allow coupling of the n-well to a known voltage potential to prevent or inhibit threshold voltage fluctuations in the device 2.

In this example, the source 22 includes an extension portion formed via a lightly doped drain (LDD) or moderately doped drain (MDD) implant prior to formation of the sidewall spacers, whereby the source 22 extends partially under the sidewall spacer 20 on a first side of the gate. In order to facilitate higher voltage operation of the DEPMOS device 2, the drain 24 is spaced from the gate 14, 16 by another sidewall spacer 20, which is effectively accomplished by masking the drain 24 during the LDD or MDD implants. However, the inventor has found that while this approach provides some useful separation or spacing of the drain 24 from the gate 14, 16, the resulting spacing may not be adequate to avoid direct tunneling and/or channel hot carrier (CHC) degradation of the thin gate oxide 14 when relatively high voltages are applied to the drain 24. Thus, although the design of the device 2 allows easy integration with streamlined CMOS fabrication processes, more reliable designs are needed, for example, where a DEPMOS is to be used for switching battery power at 6 volts or higher.

Figure 2:
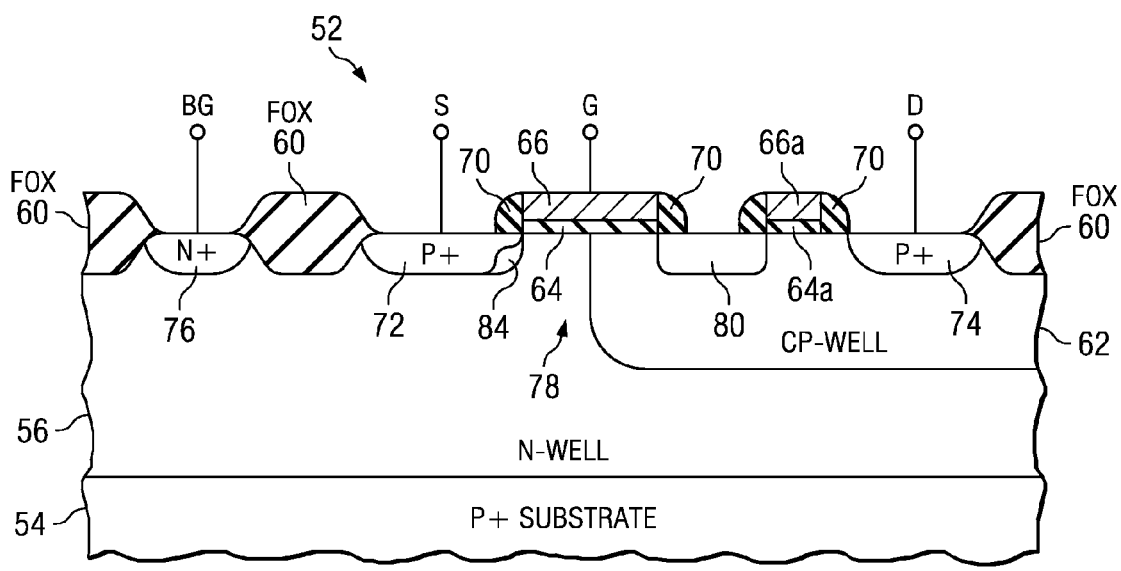
FIG. 2 is a partial side elevation view in section illustrating an exemplary drain extended PMOS transistor with a voltage drop region formed in a compensated p-well between a p-type drain and a gate in accordance with one or more aspects of the present invention.

Referring now to FIG. 2, an exemplary DEPMOS transistor device 52 is illustrated in accordance with the present invention. The transistor 52 comprises a gate with a thin gate dielectric 64 and an overlying conductive gate electrode 66, where the gate overlies an n-type channel region 78 in a semiconductor body 54. The channel 78 comprises a portion of an n-well 56 formed in the semiconductor body 54, where the device 52 may be fabricated in any type of semiconductor body 54, including but not limited to semiconductor (e.g., silicon) wafers, silicon-over-insulator (SOI) wafers, epitaxial layers in a wafer, etc. Field oxide (FOX) isolation structures 60 are formed in upper portions of the semiconductor body 54, that separate different terminals of the transistor 2 from one another and from other components in the integrated circuit, wherein shallow trench isolation (STI) or other types of isolation structures 60 may alternatively be used. A p-type source 72 is formed in the n-well 56 along a first side of the channel 78, including an extension portion (e.g., LDD, MDD, etc.) near a first side of the gate. A compensated p-well 62 is formed in a portion of the n-well 56, which extends laterally under a portion of the gate oxide 64 from a second opposite lateral side of the channel 78 beyond a second lateral side of the gate.

The DEPMOS device 52 also comprises a p-type drain 74 formed in the compensated p-well 62, where the drain 74 is spaced from the second lateral side of the gate. Between the drain 74 and the gate 64, 66, a voltage drop region 80 is provided in the compensated p-well 62, where the region 80 has fewer p-type dopants and/or more n-type dopants than does the p-well 62 in accordance with the invention. The region 80 extends outwardly toward the drain 74 from a first end proximate the second lateral side of the gate 64, 66. In the illustrated example of FIG. 2, the voltage drop region 80 is laterally spaced from the drain 74, although other implementations are possible wherein the region 80 extends further outward to the drain 74 within the scope of the invention. In addition, the exemplary DEPMOS transistor 52 comprises a dummy gate structure including a thin dielectric 64a and an overlying conductive structure 66a (e.g., polysilicon) above a portion of the compensated p-well 62, where the dummy gate 64a, 66a is laterally spaced from the second lateral side of the device gate 64, 66, thereby defining a gap therebetween. In this example, the dummy gate 64a, 66a is formed contemporaneously with the actual device gate 64, 66, although this is not a strict requirement of the invention. Further, the dummy gate structure 64a, 66a is advantageously employed in the formation of the voltage drop region 80, although the various aspects of the invention may be carried out in alternative implementations in which the dummy gate structure 64a, 66a is omitted, wherein all such variant implementations are contemplated as falling within the scope of the invention and the appended claims.

The inventor has appreciated that the voltage drop region 80 advantageously provides more robust DEMOS devices for higher voltage applications, in which the electric fields are spread out over a greater distance between the drain 74 and the gate structure 64, 66. Furthermore, the region 80 can be formed by a number of different techniques within the context of a standard CMOS process flow without adding new masks or processing steps for drain extended NMOS and/or PMOS devices. In this regard, the various aspects of the invention are applicable to drain extended NMOS transistors having a voltage drop region, in which n-doped regions may generally be replaced with p-doped regions and vice-versa (e.g., an n-type source, an n-type drain within an n-well, and a p-type channel, with a voltage drop region having fewer n-type dopants and/or more p-type dopants than the n-well). Moreover, the drain extended transistors of the invention may be fabricated using any suitable processing techniques.

In the exemplary device 2, the region 80 is located in the compensated p-well 62 so as to inhibit channel hot carrier or direct tunneling degradation of the transistor gate dielectric 64 even at high voltage operation, thereby facilitating power switching applications in battery powered consumer electronics. The invention contemplates such voltage drop regions 80 having more n-type dopants and/or fewer p-type dopants than does the p-well, which operates to shift the high fields toward the drain and away from the transistor gate dielectric so as to mitigate damage to the gate dielectric. In this regard, the voltage drop region 80 can be any region or portion 80 that has more n-type dopants (e.g., phosphorus, arsenic, antimony, etc.) and/or fewer p-type dopants (e.g., boron, indium, etc.) than that portion of the well 62 at the same depth in the semiconductor body 54, wherein the relative dopants can be characterized in terms of peak dopant concentrations, average concentrations, or any other suitable comparative criteria that compares these dopant amounts at equivalent depths from the upper surface of the semiconductor body 54.

In the device 52 of FIGS. 2 and 4A-4J, the voltage drop region 80 has more n-type dopants than the compensated p-well 62, and may preferably have fewer p-type dopants than the drain 74. In this example, the extra n-type dopants are provided to the region 80 by exposure of the region 80 to an n-type pocket implant that is concurrently provided to one or more PMOS logic transistors formed elsewhere in the wafer. In this manner, the approach of FIGS. 4A-4J does not require the addition of extra masks or processing steps to a normal CMOS fabrication process flow. In this and other implementations discussed below, the provision of the optional dummy gate structure 64a, 66a facilitates both the provision of extra n-type dopants to the region 80, as well as the formation of the drain 74 in a location that is laterally spaced relative to the gate to an extent beyond that obtained in FIG. 1 above using only a sidewall spacer 20.

Figure 3A:
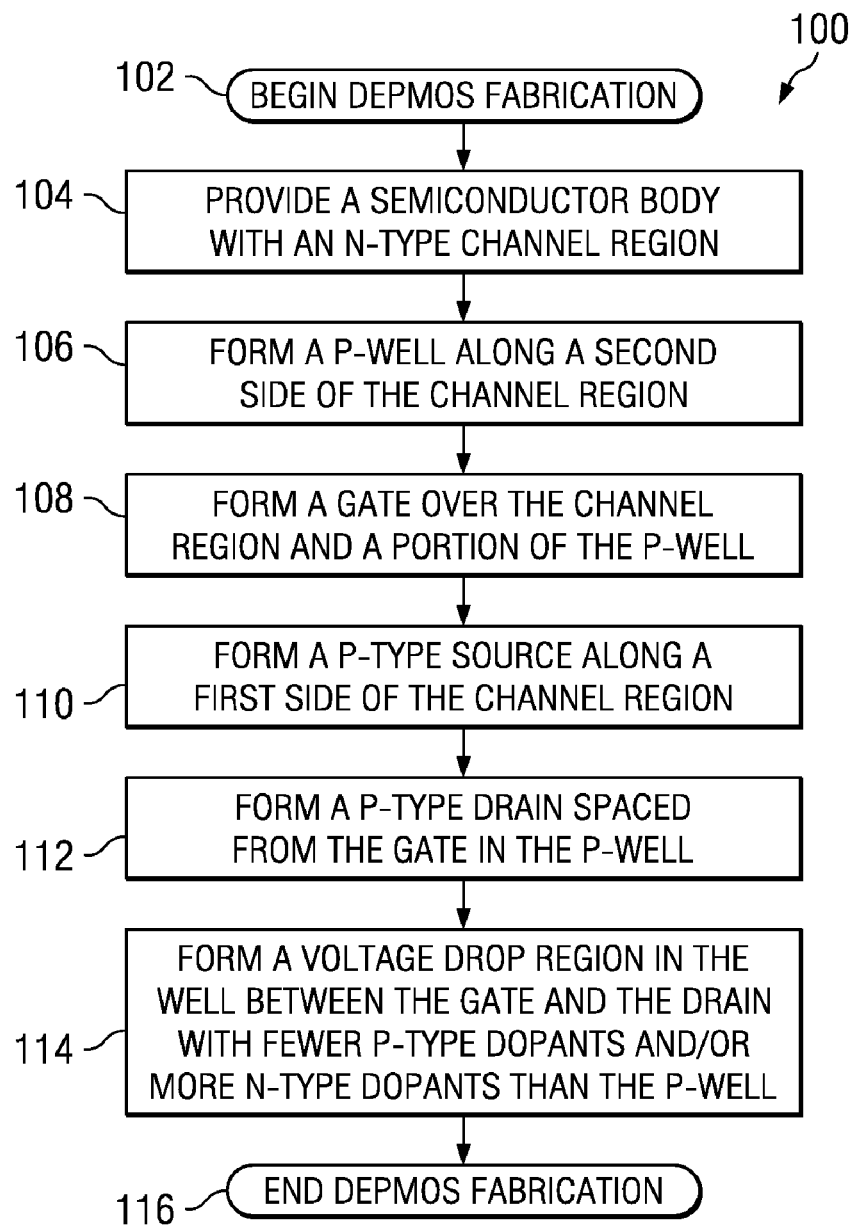
FIG. 3A is a flow diagram illustrating a method for fabricating a drain extended PMOS transistor in accordance with the invention.
Figure 3B:
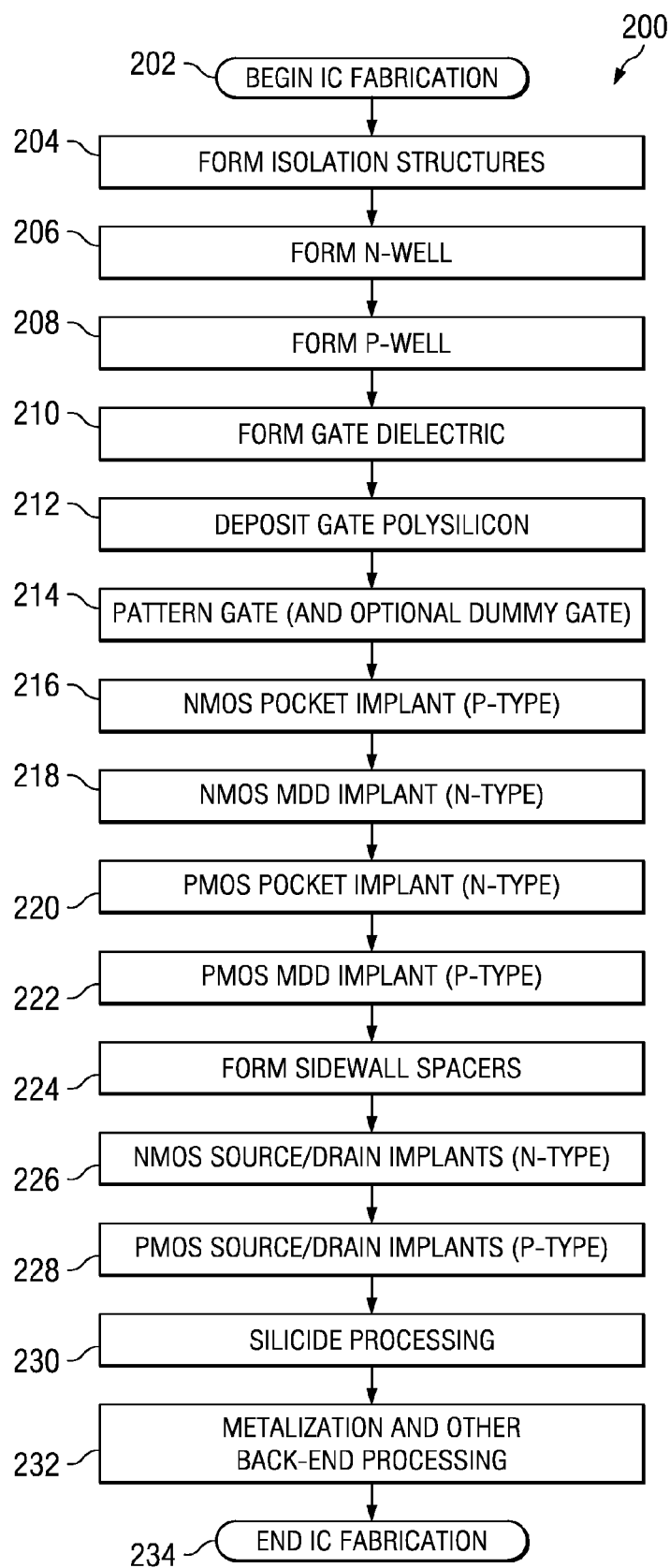
FIG. 3B is a flow diagram illustrating a method for fabricating an integrated circuit including NMOS and PMOS logic transistors, as well as a drain extended PMOS transistor with a voltage drop region in accordance with the invention.

Referring now to FIGS. 3A and 3B, another aspect of the invention relates to methods for fabricating drain extended MOS transistors. FIG. 3A illustrates an exemplary method 100 for fabricating a drain extended PMOS transistor in accordance with the invention, and FIG. 3B illustrates an integrated circuit fabrication method 200 including formation of a drain extended PMOS transistor with a voltage drop region in accordance with this aspect of the invention. While the exemplary methods 100 and 200 are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated acts may be required to implement a methodology in accordance with the present invention. Furthermore, the methods according to the present invention may be implemented in association with the fabrication of ICs and DEMOS transistors illustrated and described herein, as well as in association with other transistors and structures not illustrated, including drain extended NMOS and/or PMOS transistors.

In FIG. 3A, the method 100 begins at 102, wherein a semiconductor body is provided at 104 with an n-type channel region. The entire semiconductor body may be n-doped at 104 to provide the channel region, or an n-well or other n-type implant or diffusion may be formed in select portions of a semiconductor body to create the channel region (e.g., n-well 56 in the p-type silicon substrate 54 in FIG. 2 above). A p-well is formed at 106 alongside the channel region (e.g., p-well 62 in FIG. 2 above) using selective (e.g., masked) implantation and optional thermal annealing, diffusion, or other suitable techniques. In the examples illustrated herein, the p-well 62 is formed at 106 within a portion of the n-well 56, such that the n-well 56 is deeper than the p-well 62, whereby an n-doped region extends beneath the bottom of the compensated p-well 62 to prevent shorting of the p-type substrate 104 to the drain.

A gate is formed at 108 (e.g., gate 64, 66) over the channel region and over a portion of the p-well. In one example, an optional dummy gate structure is concurrently formed at 108 (e.g., dummy gate structure 64a, 66a in FIG. 2) to facilitate subsequent provision of additional n-type dopants in a voltage drop region of the p-well at 114 below. Any suitable materials and processing steps may be undertaken at 108 to form a gate structure and an optional dummy gate in accordance with the invention, such as deposition/growth of a thin gate dielectric (e.g., $SiO_2$ or other suitable material) and subsequent deposition of polysilicon or other suitable gate electrode material or stacks or combinations of materials, followed by selective etching to define the gate and dummy gate structures.

A p-type source (e.g., source 72) is formed at 110 along a first side of the n-type channel and a p-type drain (e.g., drain 74) is formed in the p-well at 112 that is laterally spaced from the gate. Any suitable processing steps can be employed at 110 and 112 in forming the source 72 and the drain 74, respectively, including p-type drain extension implants (e.g., LDD, MDD, etc.), n-type pocket implants, p-type deep source/drain implants, or combinations or equivalents thereof, using suitable implantation masks, which may optionally be followed by thermal annealing. A voltage drop region is formed at 114 in a portion of the p-well between the gate and the drain (e.g., region 80 in FIG. 2), which has fewer p-type dopants and/or more n-type dopants than does the corresponding portions of the compensated p-well, and the method 100 ends at 116. Any suitable techniques and fabrication processing steps may be employed in forming a voltage drop region within the scope of the invention. As illustrated and described in greater detail with respect to FIGS. 3B-6D below, many different techniques can be employed which advantageously involve only mask changes to existing CMOS fabrication process flows, whereby improved DEMOS transistors can be provided without adding cost.

Referring now to FIGS. 3B and 4A-4J, FIG. 3B illustrates an integrated circuit fabrication method 200 suitable for CMOS products, which includes formation of a drain extended PMOS transistor with a voltage drop region in accordance with the present invention. The method 200 is hereinafter described in conjunction with FIGS. 4A-4J to illustrate one exemplary implementation in which the voltage drop region 80 in the exemplary DEPMOS 52 is provided with more n-type dopants than the compensated p-well 62, wherein extra n-type dopants are implanted into the region 80 by creating an opening for the region 80 in a PMOS pocket implant mask. In this example, the same mask is also used for shallow p-type drain extension implants, wherein the region 80 will therefore also include these p-type drain extension implant dopants, although this is not a strict requirement of the invention. However, it is noted that the implementation of FIGS. 4A-4J advantageously allows formation of the voltage drop region 80 without adding new masks or processing steps to an existing CMOS fabrication flow. Similarly, a dummy gate structure (e.g., dummy gate 64a, 66a in FIG. 2) is formed concurrently with gate fabrication in the example below, wherein the only process change is to a lithography mask used to form an etch mask for gate patterning.

Figure 4A:
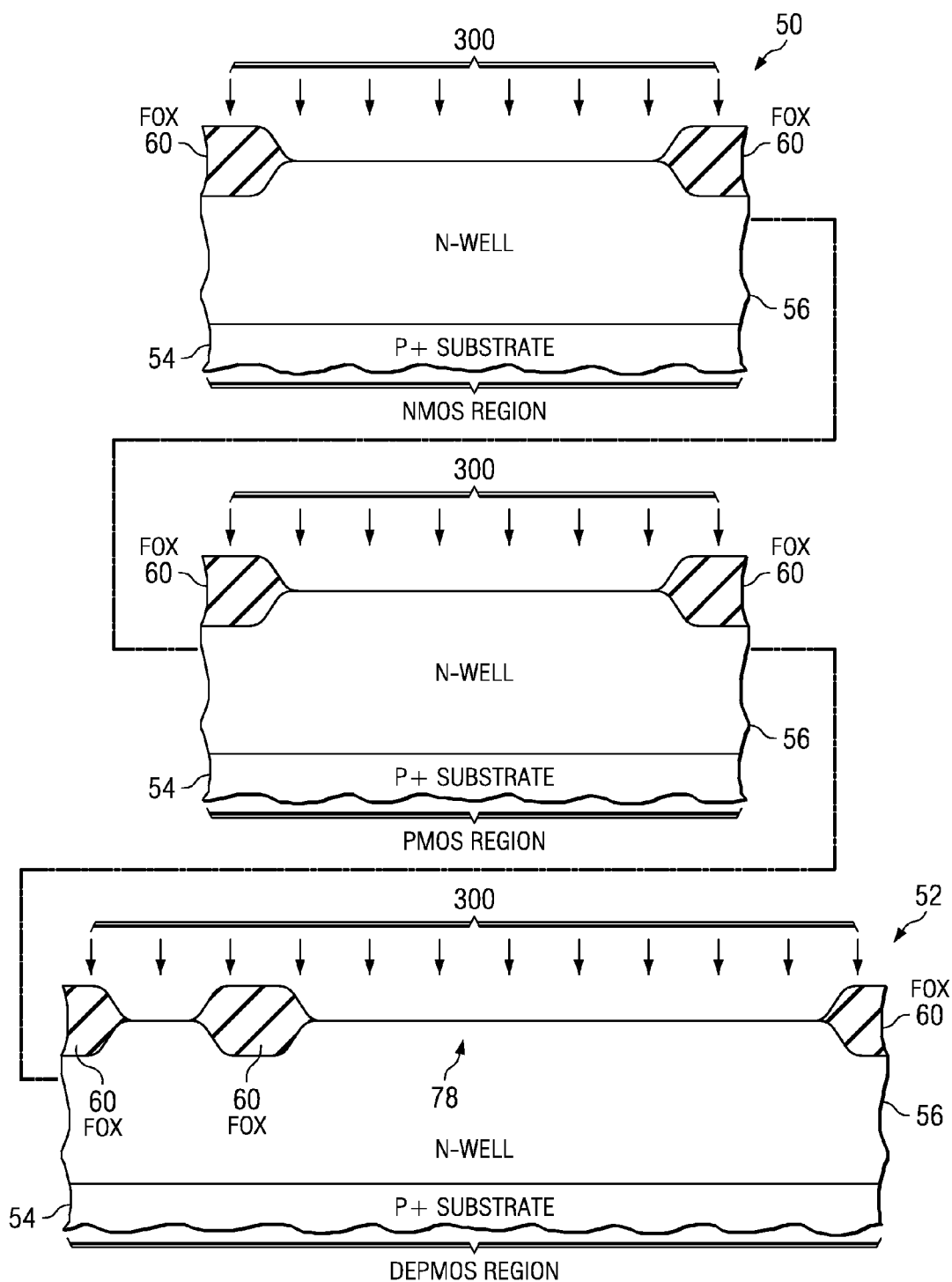
FIGS. 4A-4J are fragmentary partial side elevation views in section illustrating an exemplary integrated circuit including NMOS and PMOS logic transistors as well as the exemplary drain extended PMOS transistor of FIG. 2 undergoing fabrication processing generally in accordance with the methods of FIGS. 3A and 3B, wherein a voltage drop region of the DEPMOS transistor is formed with more n-type dopants than the compensated p-well by exposing the region during an n-type pocket implant that is concurrently provided to the PMOS logic transistor.

Referring initially to FIGS. 3B and 4A, an integrated circuit 50 is illustrated in FIG. 4A, in which NMOS and PMOS logic transistors are formed in NMOS and PMOS regions of a semiconductor body 54, respectively, along with the exemplary DEPMOS 52 in a DEPMOS region thereof. The integrated circuit fabrication method 200 begins at 202 in FIG. 3B, with isolation structures being formed in a semiconductor body at 204 (e.g., field oxide structure 60 in the device 52 in FIG. 4A), in various locations for isolating terminals of the prospective DEPMOS transistor 52 from one another and from other components. Any suitable isolation processing may be performed at 204 in accordance with the invention to form the structures 60 in the semiconductor body 54, such as local oxidation of silicon (LOCOS) processing to create field oxide structures and/or shallow trench isolation (STI) processes. An n-well is formed at 206 using any suitable processing steps, such as implantation, diffusion, etc. For example, in FIG. 4A, an implantation process 300 is employed to implant n-type dopants (e.g., phosphorus, etc.) into the semiconductor body 54, which may optionally be followed by a thermal anneal (not shown) to provide the n-well 56 in an upper portion of the semiconductor body 104, and which provides an n-doped DEPMOS channel region 78. In this example, the n-well 56 is implanted throughout the NMOS, PMOS, and DEPMOS regions, although other implementations are possible where an n-well implant mask can be employed (not shown) to selectively provide the n-well 56 in only certain regions of the integrated circuit 50.

Figure 4B:
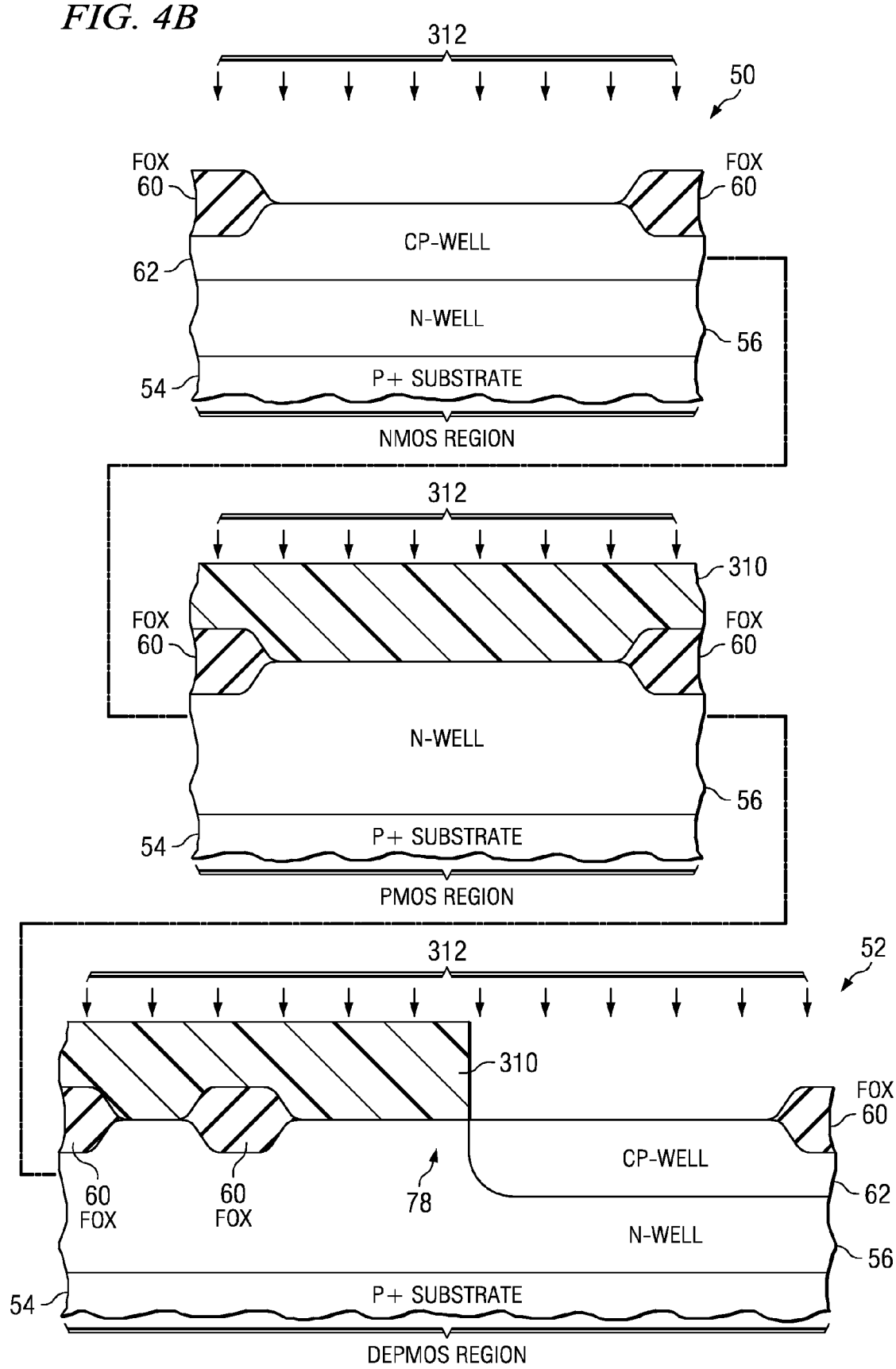

Referring also to FIG. 4B, a p-well is then formed at 208 in the NMOS region as well as in a portion of the DEPMOS region, using any suitable materials and processing steps. As illustrated in FIG. 4B, a p-well implant mask 310 is formed that exposes the NMOS region and part of the DEPMOS region, and covers the remainder of the DEPMOS region and the PMOS region, and a p-type implantation process 312 is employed to provide p-type dopants (e.g., boron, etc.) into the exposed portions of the n-well 56, which may optionally be followed by an anneal (not shown) to drive the implanted dopants deeper into the n-well 56, thereby creating the compensated p-well 62. In one possible alternate implementation of the invention, a portion of the prospective voltage drop region (e.g., region 80 in FIG. 2) may be covered by the p-well implant mask 310, whereby the region 80 will end up with fewer p-type dopants than the remainder of the compensated p-well 62, as illustrated and described further below with respect to FIG. 6A.

Figure 4C:
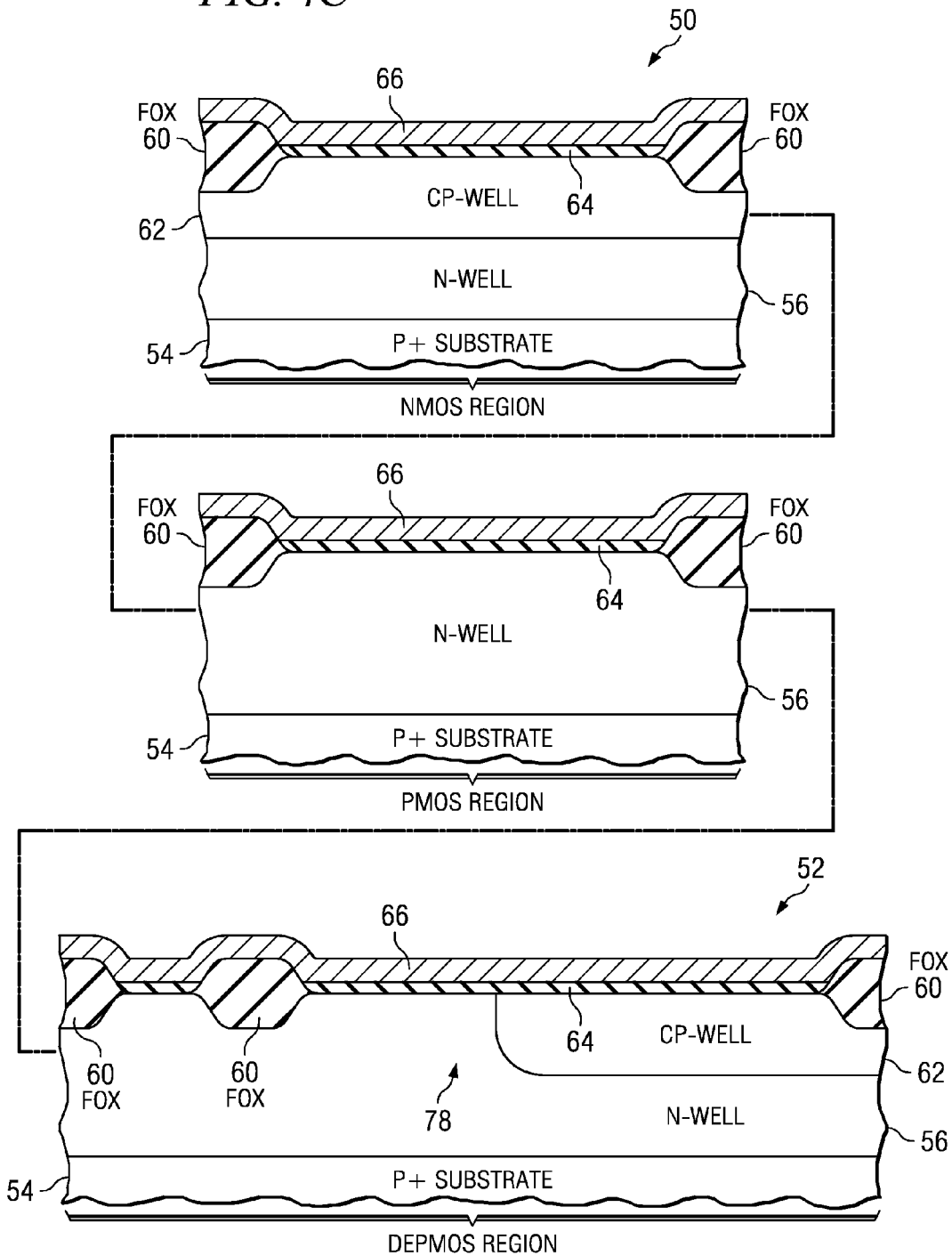

At 210, a gate dielectric is formed over the upper surfaces of the semiconductor body 54, which may be any suitable dielectric material or materials, such as a single thermally grown $SiO_2$ or other suitable single or multi-layer oxide or other dielectric material of any suitable thickness. In the exemplary IC 50 of FIG. 4C, a thin gate oxide 64 is formed by annealing the IC 50 in an oxidizing ambient, where the resulting oxide 64 covers the surface of the semiconductor body 54 in the prospective transistor areas between the isolation structures 60. Although a single gate dielectric 64 is employed in the exemplary IC 50, different oxide materials and/or oxides of different thicknesses can be separately formed at 210 for the prospective NMOS, PMOS, and DEPMOS transistors illustrated in the IC 50. One or more gate electrode layers 66 are formed at 212 over the gate dielectric 64. Any suitable materials can be used to form the gate electrode 66 within the scope of the invention, for example, conductive metals or semiconductor materials (e.g., polysilicon) or stacks or multi-layer combinations thereof, that can be doped to provide a conductive electrode for the subsequently patterned gate and optional dummy gate structures. In FIG. 4C, a single layer of polysilicon 66 is deposited over the gate dielectric 64 and over the field oxide 60, where the polysilicon 66 can be of any suitable thickness and can be formed by any suitable deposition process.

Figure 4D:
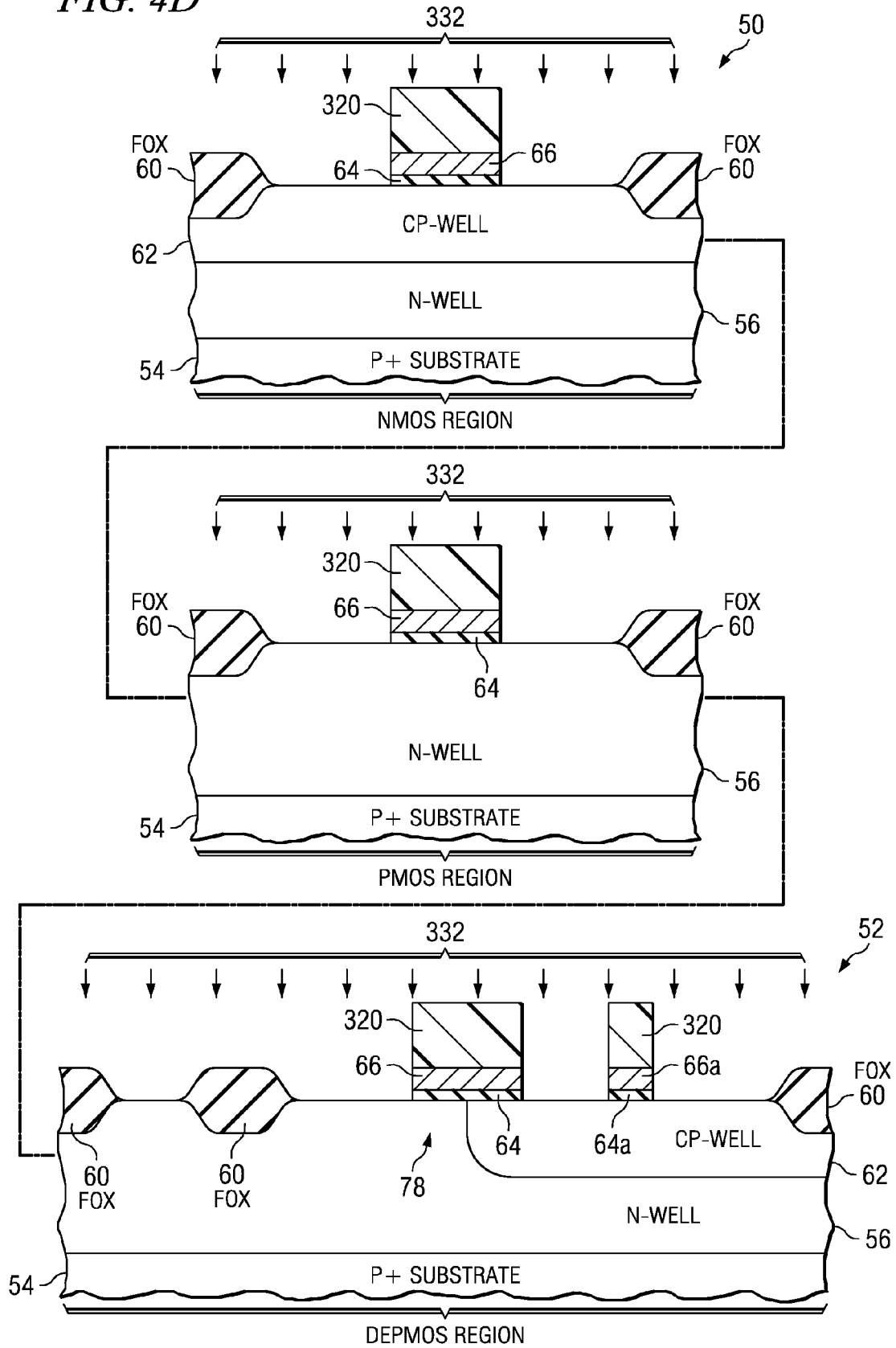

Referring also to FIG. 4D, the gate dielectric and gate electrode layers are then patterned at 214 to form the gate structure 64, 66, and the optional dummy gate 64a, 66a. In FIG. 4D, a gate etch mask 320 is formed that covers portions of the deposited polysilicon 66 in prospective gate and dummy gate regions of the IC 50, and a wet or dry etch process 322 (e.g., reactive ion etching, etc.) is performed to remove the exposed polysilicon, leaving the patterned gate structures 64, 66 in the NMOS, PMOS, and DEPMOS regions, as well as the optional dummy gate 64a, 66a spaced from the DEPMOS gate 64, 66 above the p-well 62. Other implementations of the invention are possible wherein the dummy gate structure 64a, 66a is omitted. It is noted that the dummy gate structure 64a, 66a advantageously facilitates spacing the prospective drain 74 (FIG. 2) out farther from the gate than was the case in FIG. 1 above, and also facilitates providing additional n-type dopants to the prospective voltage drop region 80, as illustrated and described further below, without adding any extra masks or processing steps.

Figure 4E:
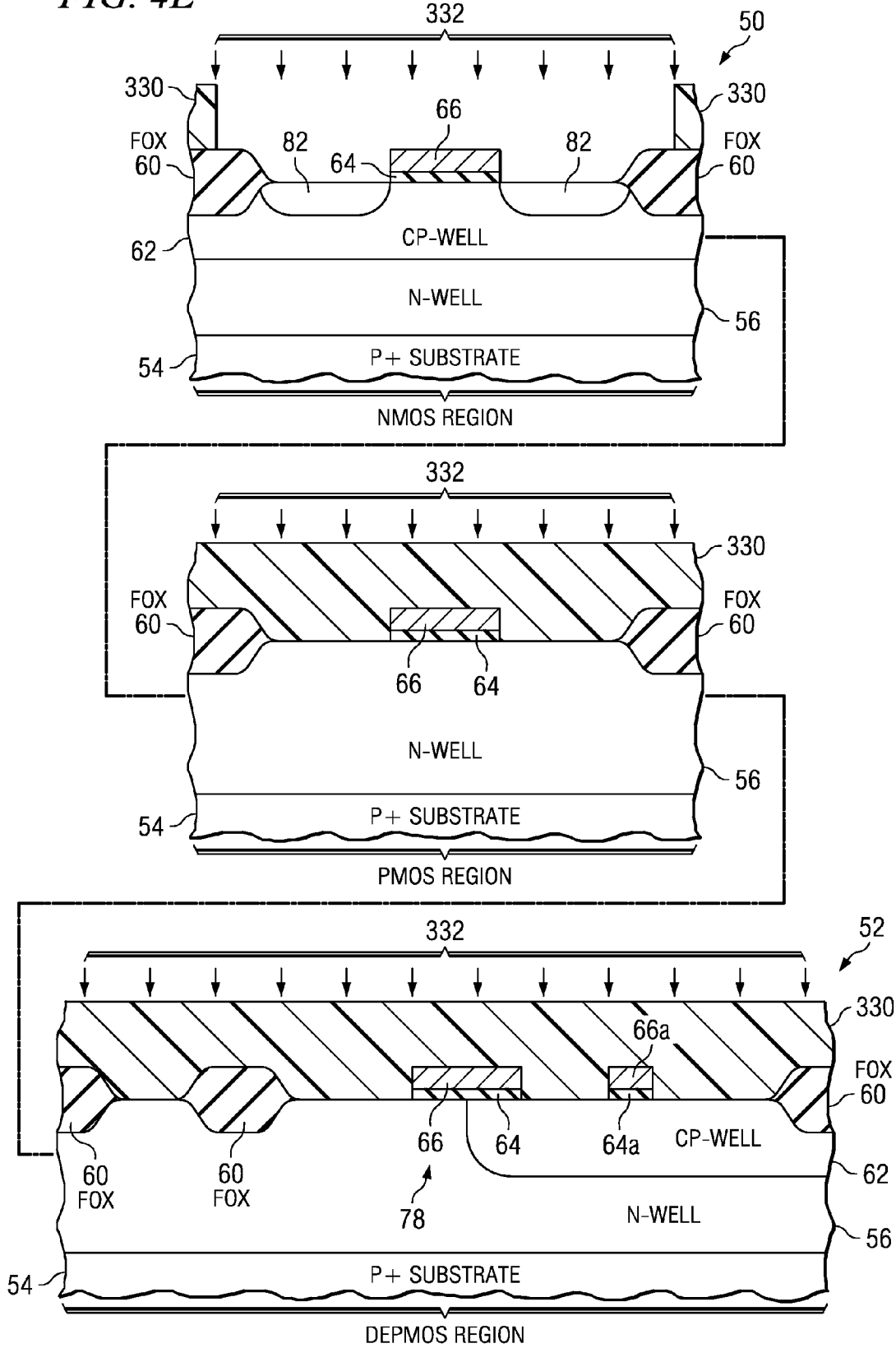
Figure 4F:
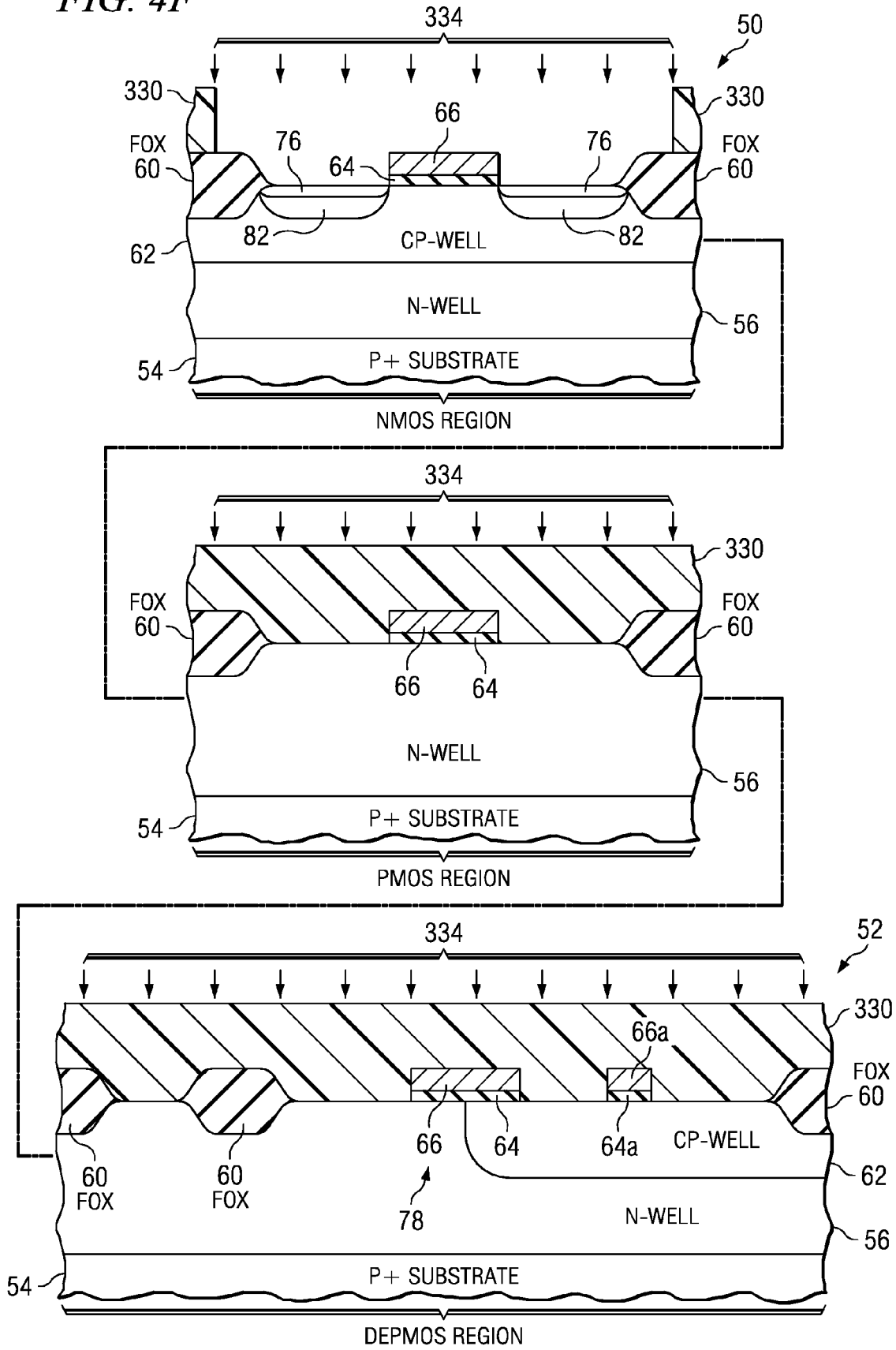

Referring also to FIGS. 4E and 4F, after the gates 64, 66 and the optional dummy gate 64a, 66a have been patterned, a P+ NMOS pocket or halo implant is performed at 216, for example, by selective implantation of p-type dopants into portions of the semiconductor body 54 in the NMOS region for subsequently defined NMOS source/drains. In FIG. 4E, an NMOS pocket/MDD implant mask 330 is formed over the semiconductor body 54, exposing prospective pocket implant regions 82 (e.g., prospective source/drains) in the NMOS region and covering the PMOS and DEPMOS region, and an implantation process 332 is performed using the patterned NMOS gate structure 64, 66 for alignment of the resulting P+ pocket regions 82. The p-type NMOS pocket or halo implant 332 may be an angled implant so as to locate some of the p-type dopants slightly under the edges of the NMOS gate dielectric 64. At 218 in FIG. 3B, one or more NMOS lightly-doped drain (LDD) or moderately-doped drain (MDD) implants are performed to provide n-type dopants to initially define the NMOS source/drains 76. As illustrated in FIG. 4F, with the mask 330 remaining over the IC 50, an implantation process 334 is performed to provide n-type dopants to the exposed NMOS region, thereby doping shallow portions 76 of the prospective NMOS source/drains.

Figure 4G:
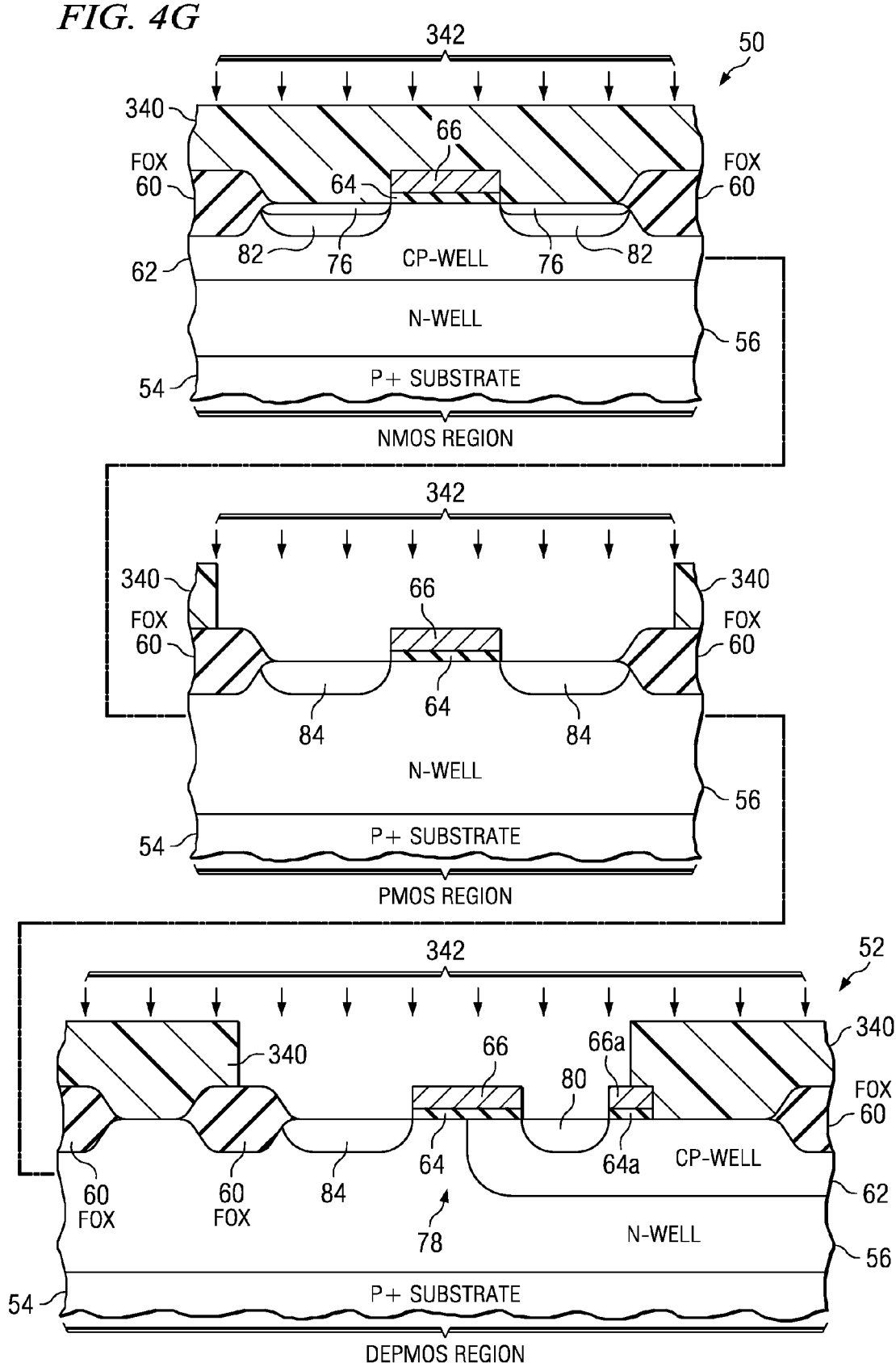
Figure 4H:
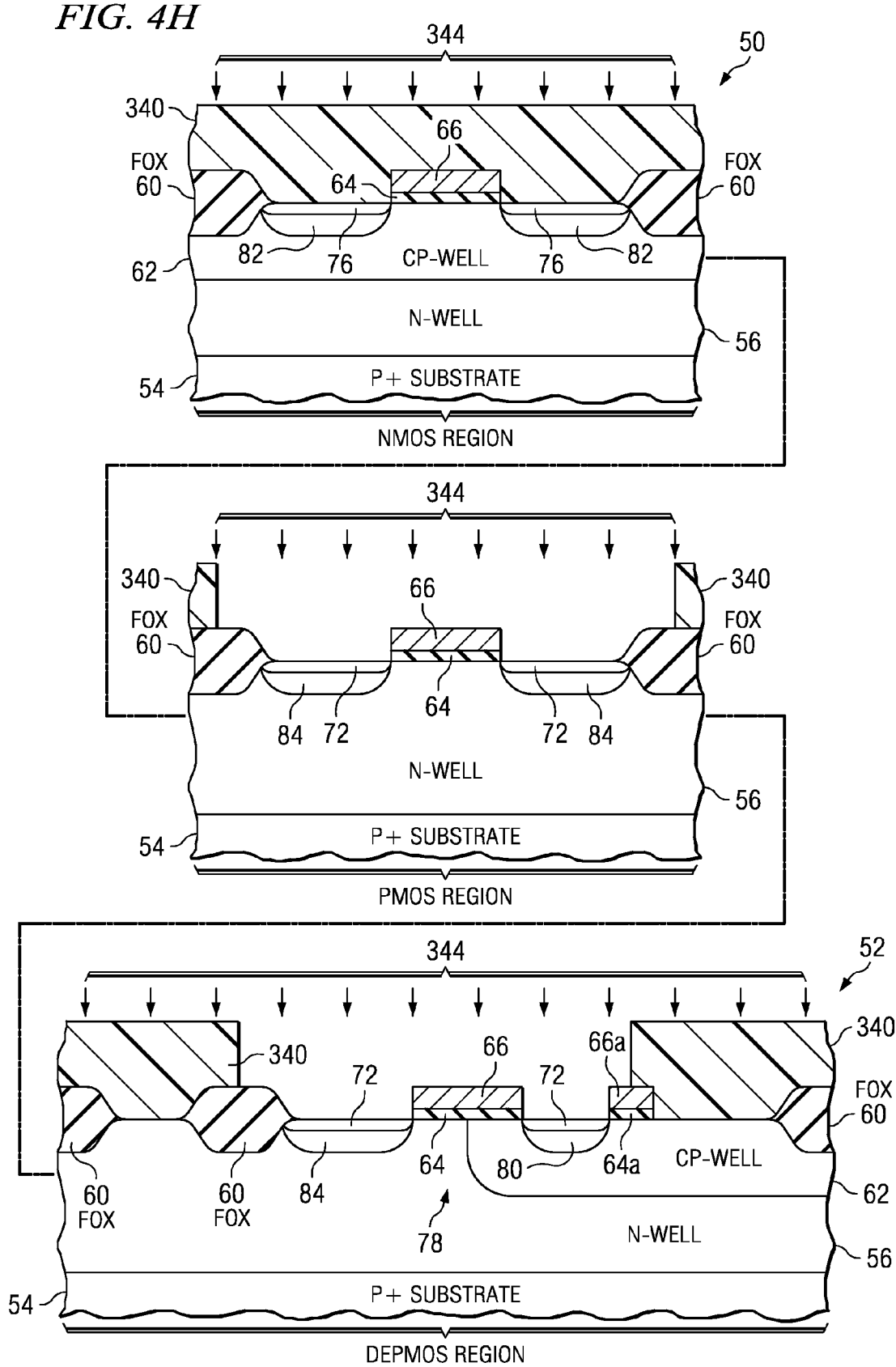

Referring also to FIGS. 4G and 4H, an N+ PMOS pocket or halo implant is performed at 220 into portions of the semiconductor body 54 in the PMOS region for subsequently defined PMOS source/drains, as well as into a halo or pocket region 84 in the prospective source 72 and the voltage drop region 80 of the DEPMOS device 52. In FIG. 4G, a PMOS pocket/MDD implant mask 340 is formed that exposes the prospective source pocket region 84 and the voltage drop region 80 of the DEPMOS 52, as well as the prospective source/drains 84 in the PMOS region, where the mask 340 covers the NMOS region. An n-type pocket implant process 342 is performed using the patterned PMOS gate structure 64, 66 for alignment of the resulting N+ pocket regions 84 in the PMOS region, and also employs the patterned gate 64, 66 and dummy gate 64a, 66a in the DEPMOS region to align the resulting implantation of n-type dopants into the DEPMOS source 84 and voltage drop region 80, wherein the PMOS pocket implant 342 may be an angled implant.

In this manner, extra n-type dopants are provided in the voltage drop region 80, whereby the region 80 has more n-type dopants than the corresponding remainder of the compensated p-well 62 in accordance with the invention, without adding new masks or process steps. In another alternative implementation of the invention, the addition of n-type dopants into the voltage drop region 80 at 220 may be combined with selective masking of all or a portion of the region 80 during the initial p-well formation at 208, as illustrated and described further below with respect to FIGS. 6A-6D. At 222 in FIG. 3B, a PMOS MDD implant is performed to provide p-type dopants to initially define the PMOS source/drains 72, as illustrated in FIG. 4H, via an implantation process 344 with the mask 340 remaining in place, which results in some p-type dopants also being added to a shallow portion of the voltage drop region 80, although this is not a requirement of the invention. However, even with the additional p-type dopants, the resulting voltage drop region 80 still has more n-type dopants and/or fewer p-type dopants than does the compensated p-well 62.

Figure 4I:
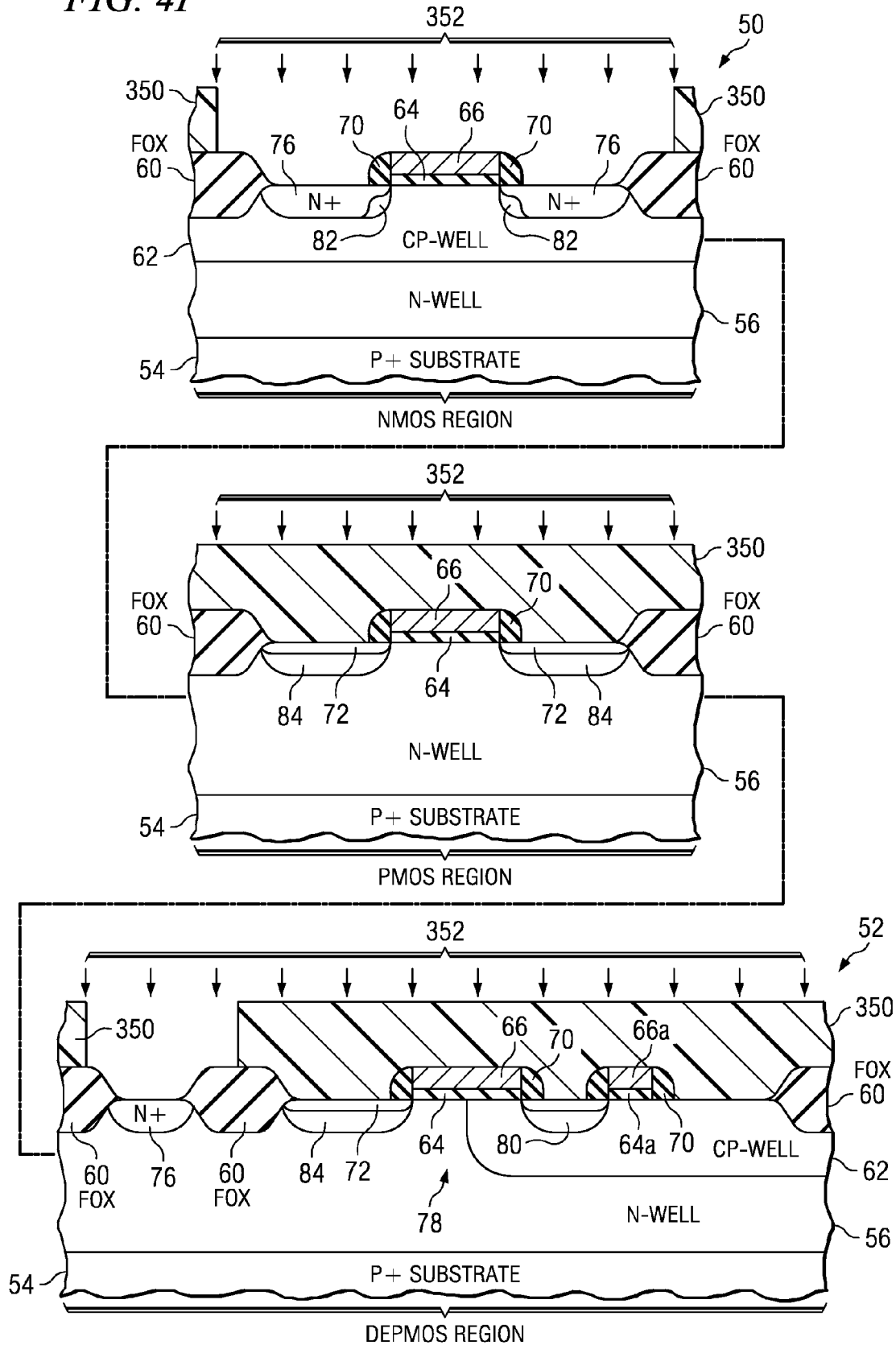
Figure 4J:
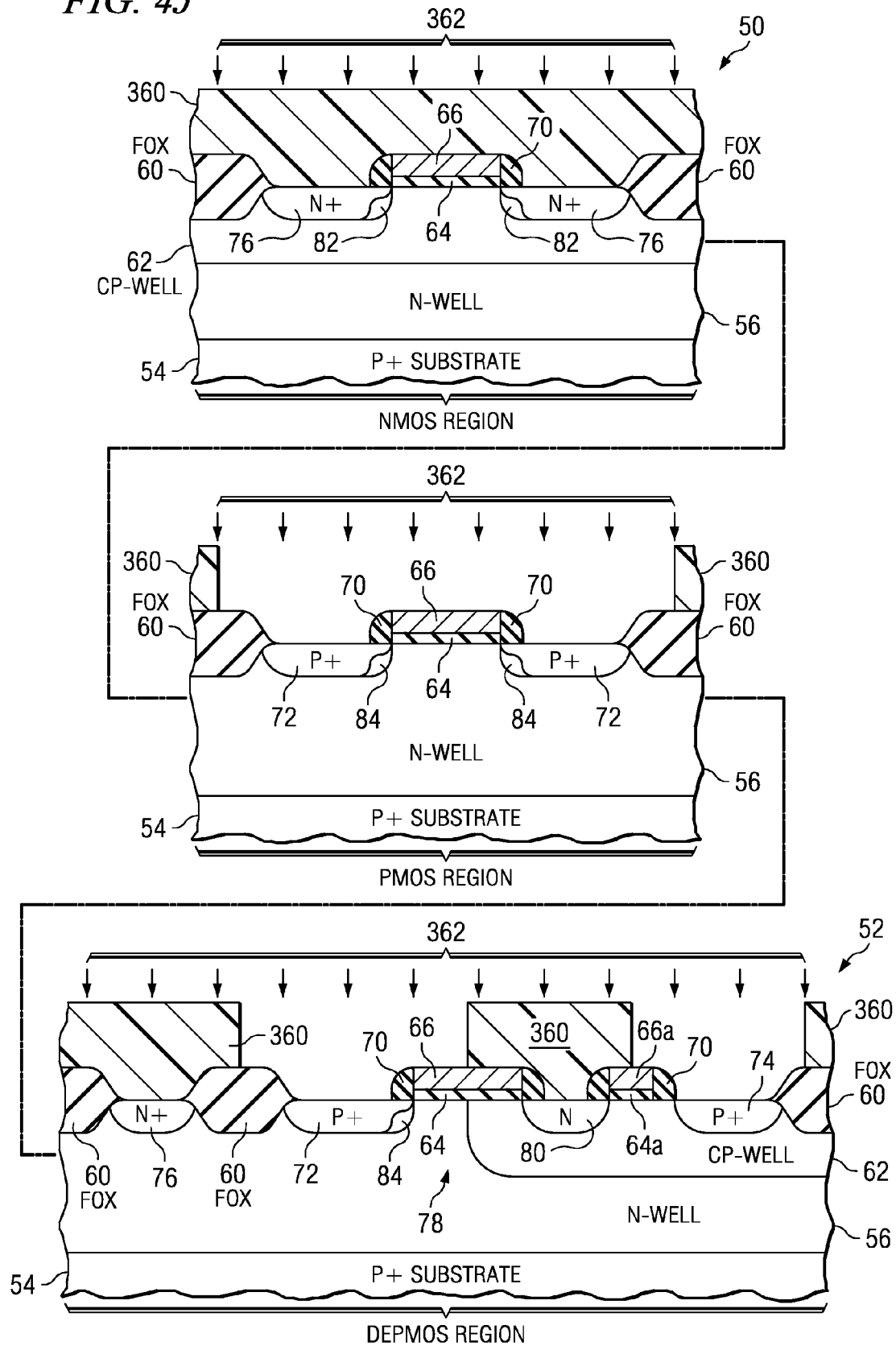

Referring also to FIGS. 4I and 4J, sidewall spacers are then formed at 224, such as the exemplary spacers 70 in FIG. 4I, along the lateral sidewalls of the patterned gate and dummy gate structures. Any suitable materials and/or processes may be employed in forming the sidewall spacers 70 at 224, for example, single or multi-layer structures of silicon nitride or other suitable materials, which are initially deposited using a conformal deposition process, and then etched back using a generally anisotropic etch process (not shown), leaving the spacers 70 of FIG. 4I. With the spacers 70 in place, n and p-type source/drain implantations are then performed at 226 and 228 of FIG. 3B, respectively. In FIG. 4I, an NMOS source/drain implant mask 350 is formed, which exposes the prospective source/drains in the NMOS region and a prospective back gate in the DEPMOS region, and which covers the PMOS region. An n-type implantation process 352 is performed, which may optionally be followed by an anneal process (not shown), by which the NMOS source/drains 76 and the DEPMOS back gate 76 are defined. As illustrated and described further below with respect to FIG. 5B, the voltage drop region 80 may alternatively be exposed by the NMOS source/drain implant mask 350, whereby the implantation 352 can be used to provide additional n-type dopants to the region 80 using an existing mask and process step in accordance with the invention.

In FIG. 4J, a PMOS source/drain implant mask 360 is formed that exposes the prospective source/drains in the PMOS region, as well as the source 72 and the drain 74 in the DEPMOS region. A p-type implantation process 362 is then performed, which may be followed by an optional thermal anneal, by which the DEPMOS source 72 and drain 74 are formed. It is noted in FIG. 4J that the positioning of the dummy gate structure 64a, 66a establishes or defines the lateral spacing distance between the drain 74 and the actual gate 64, 66, by which a larger spacing distance can be achieved than was possible using only sidewall spacers, as in the DEPMOS device 2 of FIG. 1 above, wherein the dummy gate structure 64a, 66a is added at no extra cost (e.g., no extra masks or process steps). After the PMOS source/drain implant, silicide processing is performed at 230 to create conductive metal silicide material (not shown), after which metalization and other back-end processing is performed at 232 to create a multi-level interconnection structure (not shown), before the exemplary method 200 ends at 234.

The methods 100 and 200 of FIGS. 3A and 3B and the above exemplary implementation of FIGS. 4A-4J illustrate one of many ways in which a voltage drop region 80 can be formed in a DEPMOS device 52 having fewer p-type and/or more n-type dopants than the compensated p-well 62 within the scope of the invention. Several other exemplary approaches are hereinafter illustrated and described with respect to FIGS. 5A-6D, in which various masks are changed in implementing the general fabrication method 200 of FIG. 3B, so as not to add cost to the integrated circuit 50. Other approaches are also possible, for example, wherein extra masks and/or processing steps are added to provide n-type dopants to the region 80.

In the case of a DEPMOS, all or a portion of the region 80 can be masked at p-well formation (208 in FIG. 3B), alone or in combination with exposing all or a portion of the region 80 when n-type dopants are implanted (e.g., during PMOS pocket implants at 220, NMOS source/drain implants at 226 in FIG. 3B, and/or n-type threshold adjust implants or other steps at which n-type dopants are implanted or diffused), wherein all such variant implementations are contemplated as falling within the scope of the invention and the appended claims. For DENMOS implementations, all or a portion of the device voltage drop region can be masked at n-well formation (206 in FIG. 3B), alone or in combination with exposing all or a portion of the region when p-type dopants are implanted (e.g., during NMOS pocket implants at 216, PMOS source/drain implants at 228 in FIG. 3B, and/or during p-type threshold adjust implants or other steps at which p-type dopants are implanted or diffused) within the scope of the invention.

Figure 5A:
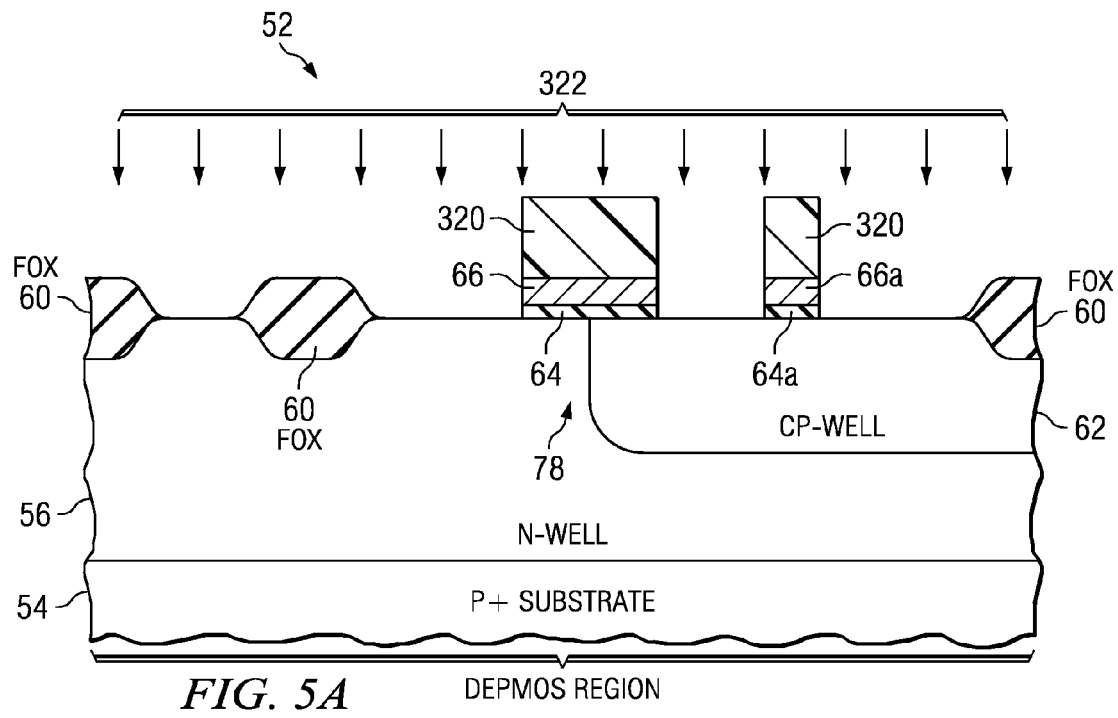
FIGS. 5A-5C are fragmentary partial side elevation views in section illustrating the integrated circuit including another possible implementation of the drain extended PMOS transistor of FIG. 2 undergoing fabrication processing generally in accordance with the methods of FIGS. 3A and 3B, wherein the voltage drop region is formed with more n-type dopants than the compensated p-well by exposing the region during an n-type source/drain implant that is concurrently provided to the NMOS logic transistor.
Figure 5B:
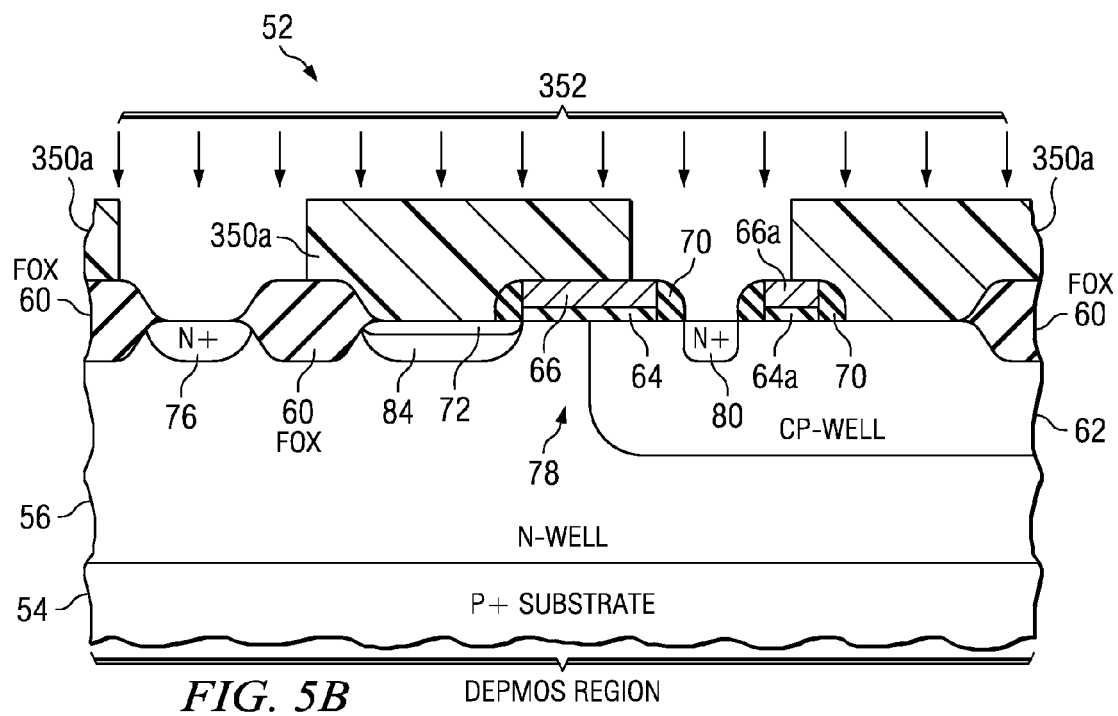
Figure 5C:
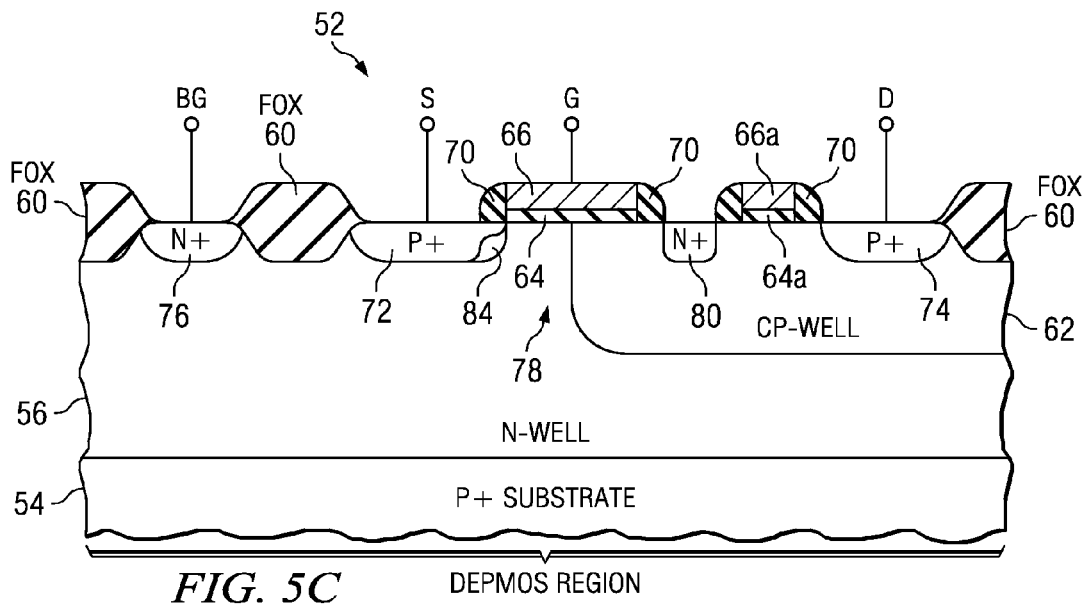

FIGS. 5A-5C illustrate fabrication of the DEPMOS transistor 52 in which the voltage drop region 80 is formed with more n-type dopants than the compensated p-well 62 by exposing the region 80 during an n-type source/drain implant (e.g., at 226 in FIG. 3B) that is concurrently provided to the NMOS logic transistor. FIG. 5A illustrates the DEPMOS device 52 during gate etching (214 in FIG. 3B) using the gate etch mask 320 and the etch process 322, wherein both the DEPMOS gate 64, 66 and the dummy gate structure 64a, 66a are created, leaving a gap therebetween above the prospective voltage drop region. FIG. 5B illustrates the device 52 during NMOS source/drain implantation using a slightly modified mask 350a and the implantation process 352 (e.g., at 226 in FIG. 3B), wherein the mask 352a includes an opening to provide dopants to the region 80 between sidewall spacers 70 in the gap between the device gate 64, 66 and the dummy gate 64a, 66a. FIG. 5C illustrates this implementation of the DEPMOS 52 prior to silicide and other back-end processing.

Figure 6A:
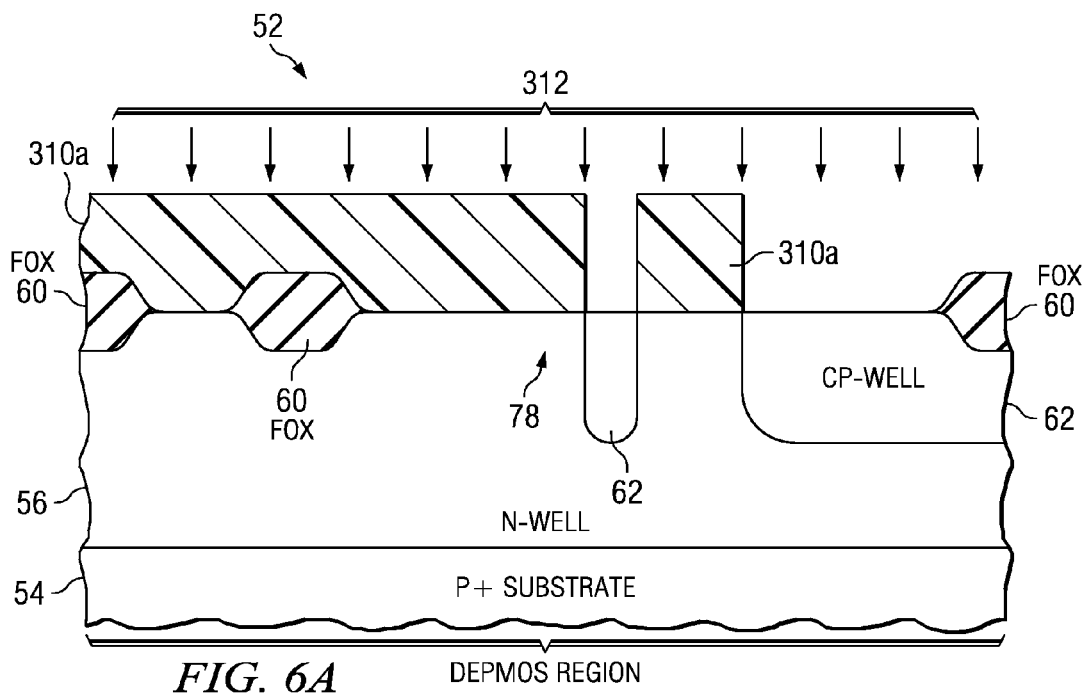
FIGS. 6A-6D are fragmentary partial side elevation views in section illustrating integrated circuit with another possible implementation of the drain extended PMOS transistor of FIG. 2 undergoing fabrication processing generally in accordance with the methods of FIGS. 3A and 3B, wherein the voltage drop region of the DEPMOS transistor is formed with more n-type dopants and fewer p-type dopants than the compensated p-well by covering the region while forming the p-well and exposing the region during an n-type pocket implant that is concurrently provided to the PMOS logic transistor.
Figure 6B:
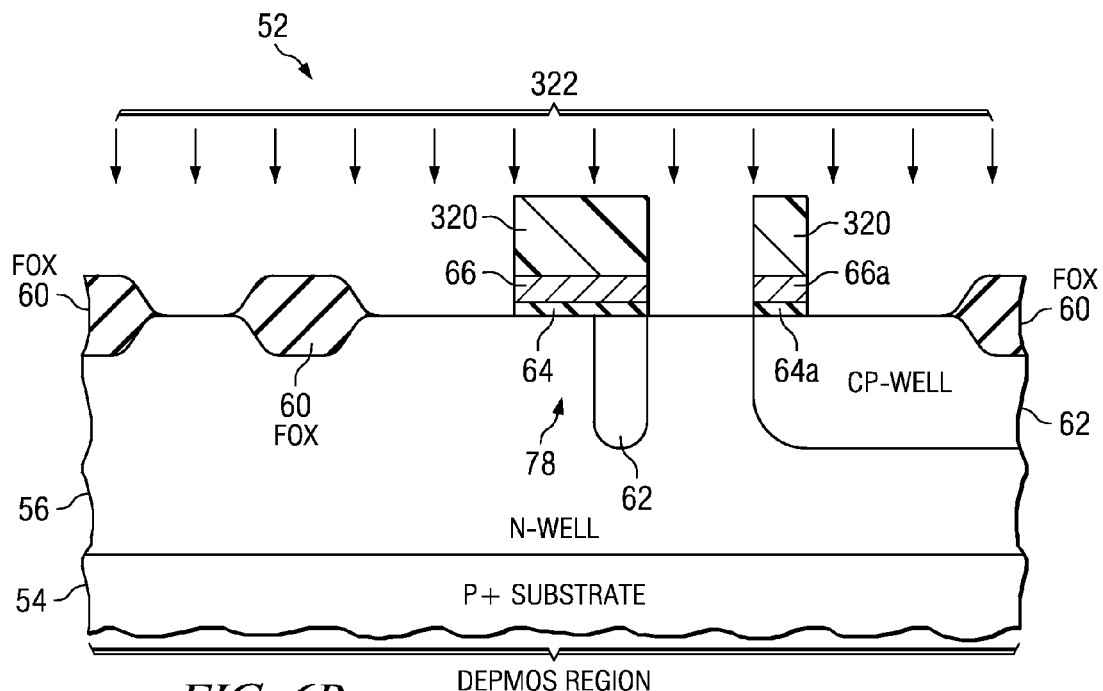
Figure 6C:
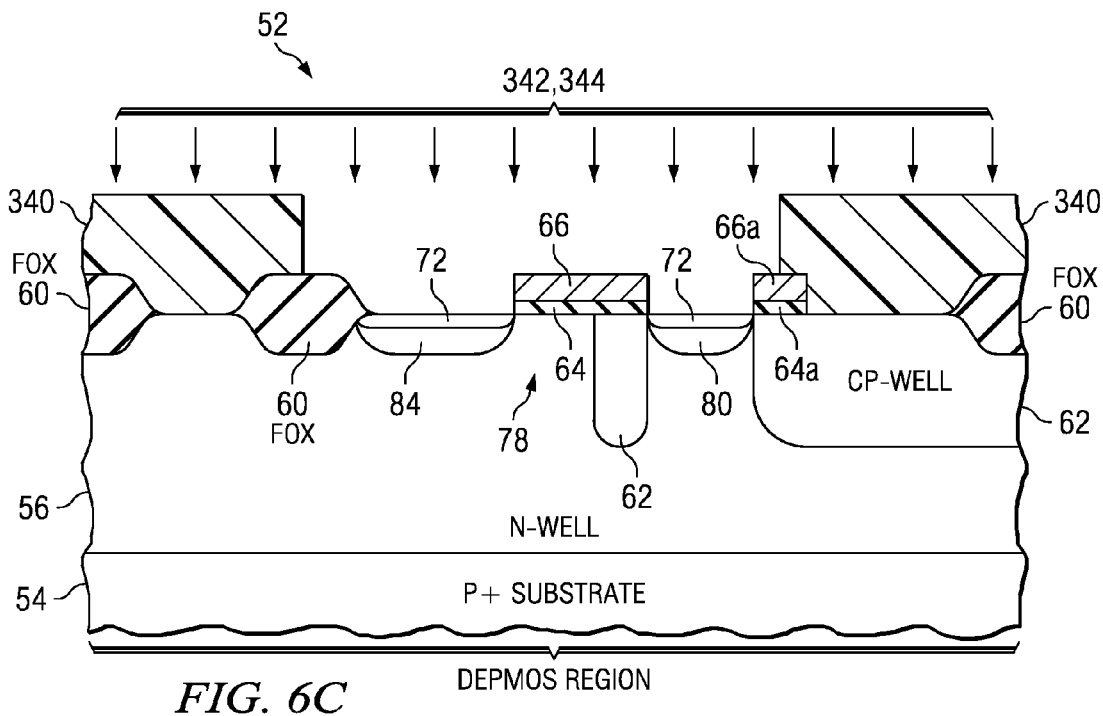
Figure 6D:
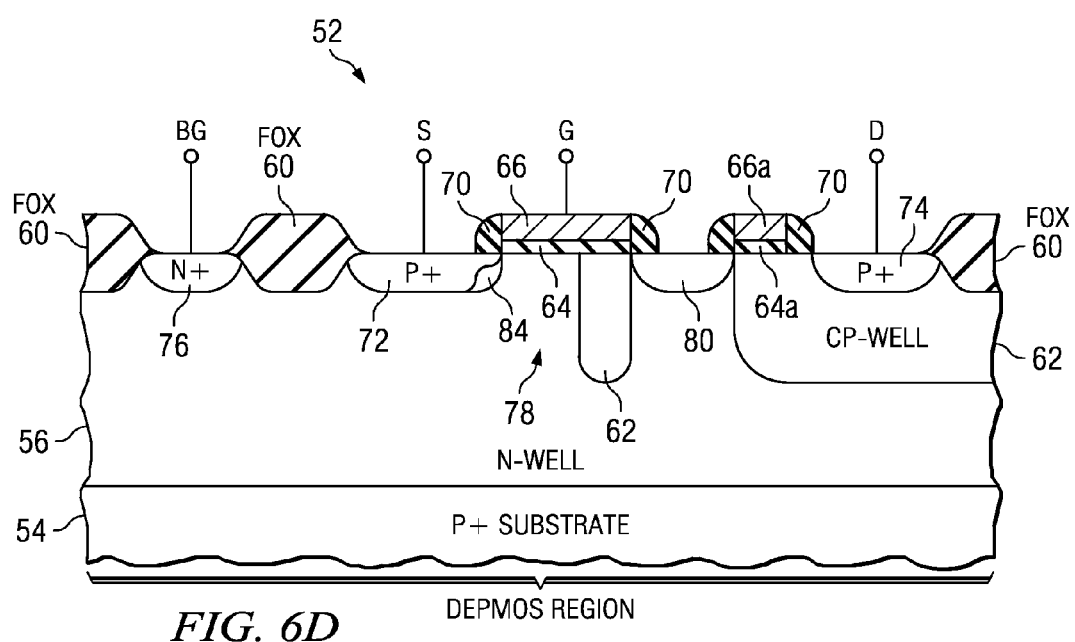

FIGS. 6A-6D illustrate another possible implementation of the invention, wherein the voltage drop region 80 is formed with more n-type dopants and fewer p-type dopants than p-well 62 by covering the region 80 during the p-well formation (208 in FIG. 3B) and by exposing the region 80 during the PMOS (n-type) pocket implant (220 in FIG. 3B). FIG. 6A illustrates the device 52 during p-well formation (208 in FIG. 3B) in which a modified p-well implant mask 310a covers all or a portion of the prospective voltage drop region 80 during the implantation 312, whereby the region 80 has fewer p-type dopants than does the compensated p-well 62. In FIG. 6B, the device 52 undergoes gate etching (214 in FIG. 3B) via the mask 320 and the etch process 322 to define the DEPMOS gate 64, 66 and the dummy gate structure 64a, 66a as in the above examples. FIG. 6C illustrates the DEPMOS transistor 52 undergoing a PMOS pocket/MDD implant using the mask 340 that exposes the prospective source pocket region 84 of the DEPMOS 52 and the region 80 during the n-type pocket implant process 342, and also the p-type MDD implant 344 (e.g., at 220 and 222 of FIG. 3B), whereby extra n-type dopants are provided in the voltage drop region 80. The device 52 is illustrated in FIG. 6D prior to silicide and other back-end processing. It is noted that the dummy gate structure 64a, 66a is employed in the above examples to facilitate provision of extra n-type dopants to the voltage drop region 80 and to align the inner side of the drain 74, although other implementations are possible wherein the dummy gate is omitted.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a drain-extending MOS transistor, the method comprising:
  providing a semiconductor body having a channel region therein, the channel region being of a first conductivity type and having first and second opposite lateral sides;
  forming a well of a second conductivity type extending laterally outward only from the second lateral side of the channel region in the semiconductor body;
  forming a gate having first and second lateral sides, the gate including a thin gate dielectric positioned only at a location of the gate, the gate and thin gate dielectric overlying the channel region and a portion of the well;
  forming a source of the second conductivity type in the semiconductor body along the first lateral side of the channel region, the source being proximate the first lateral side of the gate;
  forming a drain of the second conductivity type spaced from the second lateral side of the gate in the well; and
  forming a voltage drop region in the well extending laterally between a first end proximate the second lateral side of the gate to a second end laterally spaced from the drain to shift high electric fields toward the drain and away from the gate thereby mitigating degradation of the gate dielectric in a high voltage operation, the voltage drop region comprising dopants of the second conductivity type, and wherein an operational voltage drop region has fewer dopants of the second conductivity type than that portion of the well at the same depth, wherein forming the voltage drop region comprises using an existing mask and processing step and exposing at least a portion of the voltage drop region while performing a source/drain implant for another transistor using dopants of the first conductivity type.

2. The method of claim 1, further comprising forming a dummy gate overlying a portion of the well, the dummy gate being laterally spaced from the second lateral side of the gate.

3. The method of claim 1, wherein the second end of the voltage drop region is laterally spaced from the drain.

4. The method of claim 1, wherein the first conductivity type is n-type, and wherein the second conductivity type is p-type.

5. A method of fabricating a drain-extended MOS transistor, the method comprising:
  providing a semiconductor body having a channel region therein, the channel region being of a first conductivity type and having first and second opposite lateral sides;
  forming a well of a second conductivity type extending laterally outward only from the second lateral side of the channel region in the semiconductor body, wherein a voltage drop region is defined therein as a region extending between a first end proximate the second lateral side of the channel region to a second end within the well, the voltage drop region comprising dopants of the second conductivity type, and wherein an operational voltage drop region contains less dopant of the second conductivity type than that portion of the well at the same depth by blocking dopant thereat during the well formation using an existing mask and processing step;

forming a gate having first and second lateral sides, the gate overlying the channel region and a portion of the well;

forming a source of the second conductivity type in the semiconductor body along the first lateral side of the channel region, the source being proximate the first lateral side of the gate; and forming a drain of the second conductivity type spaced from the second lateral side of the gate in the well.

6. The method of claim 1, wherein the voltage drop region has more dopants of the first conductivity type than the well.

7. A method of fabricating a drain-extended MOS transistor, the method comprising:

providing a semiconductor body having a channel region therein, the channel region being of a first conductivity type and having first and second opposite lateral sides;

forming a well of a second conductivity type extending laterally outward only from the second lateral side of the channel region in the semiconductor body;

forming a gate having first and second lateral sides, the gate including a thin gate dielectric positioned only at a location of the gate, the gate and thin gate dielectric overlying the channel region and a portion of the well;

forming a source of the second conductivity type in the semiconductor body along the first lateral side of the channel region, the source being proximate the first lateral side of the gate;

forming a drain of the second conductivity type spaced from the second lateral side of the gate in the well; and forming a voltage drop region in the well extending between a first end proximate the second lateral side of the gate to a second end laterally spaced from the drain, the voltage drop region comprising dopants of the second conductivity type, and wherein an operational voltage drop region has fewer dopants of the second conductivity type than that portion of the well at the same depth, wherein forming the voltage drop region comprises using an existing mask and processing step and exposing at least a portion of the voltage drop region while performing a pocket implant using dopants of the second conductivity type while forming the source and/or while forming the drain.

8. A method of fabricating a drain-extended MOS transistor, the method comprising:

providing a semiconductor body having a channel region therein, the channel region being of a first conductivity type and having first and second opposite lateral sides;

forming a well of a second conductivity type extending laterally outward only from the second lateral side of the channel region in the semiconductor body;

forming a gate having first and second lateral sides, the gate including a thin gate dielectric positioned only at a location of the gate, the gate and thin gate dielectric overlying the channel region and a portion of the well;

forming a source of the second conductivity type in the semiconductor body along the first lateral side of the channel region, the source being proximate the first lateral side of the gate;

forming a drain of the second conductivity type spaced from the second lateral side of the gate in the well; and forming a voltage drop region in the well extending between a first end proximate the second lateral side of the gate to a second end laterally spaced from the drain, the voltage drop region comprising dopants of the first conductivity type, and wherein an operational voltage drop region has more dopants of the first conductivity type than that portion of the well at the same depth, wherein forming the voltage drop region comprises using an existing mask and processing step and exposing at least a portion of the voltage drop region while performing a source/drain implant for another transistor using dopants of the first conductivity type.

9. The method of claim 8, further comprising forming a dummy gate overlying a portion of the well, the dummy gate being laterally spaced from the second lateral side of the gate.

10. The method of claim 8, wherein the voltage drop region has fewer dopants of the second conductivity type than the well.

11. The method of claim 5, further comprising:

forming a voltage drop region in the well extending between a first end proximate the second lateral side of the gate to a second end laterally spaced from the drain, wherein an operational voltage drop region has more dopants of the first conductivity type than the well.

12. The method of claim 8, wherein the first conductivity type is n-type, and wherein the second conductivity type is p-type.

13. A method of fabricating a drain-extended MOS transistor, the method comprising:

providing a semiconductor body having a channel region therein, the channel region being of a first conductivity type and having first and second opposite lateral sides;

forming a well of a second conductivity type extending laterally outward only from the second lateral side of the channel region in the semiconductor body;

forming a gate having first and second lateral sides, the gate including a thin gate dielectric positioned only at a location of the gate, the gate and thin gate dielectric overlying the channel region and a portion of the well;

forming a source of the second conductivity type in the semiconductor body along the first lateral side of the channel region, the source being proximate the first lateral side of the gate;

forming a drain of the second conductivity type spaced from the second lateral side of the gate in the well; and forming a voltage drop region in the well extending between a first end proximate the second lateral side of the gate to a second end laterally spaced from the drain, the voltage drop region comprising dopants of the first conductivity type, and wherein an operational voltage drop region has more dopants of the first conductivity type than that portion of the well at the same depth, wherein forming the voltage drop region comprises using an existing mask and processing step and exposing at least a portion of the voltage drop region while performing a pocket implant using dopants of the second conductivity type while forming the source and/or while forming the drain.

* * * * *